(12) United States Patent
Bieselt

(10) Patent No.: US 9,613,878 B2
(45) Date of Patent: Apr. 4, 2017

(54) CARRIER AND A METHOD FOR PROCESSING A CARRIER

(71) Applicant: Infineon Technologies Dresden GmbH, Dresden (DE)

(72) Inventor: Steffen Bieselt, Wehlen (DE)

(73) Assignee: Infineon Technologies Dresden GmbH, Dresden (DE)

( * ) Notice: Subject to any disclaimer, the term of this patent is extended or adjusted under 35 U.S.C. 154(b) by 266 days.

(21) Appl. No.: 14/098,570

(22) Filed: Dec. 6, 2013

(65) Prior Publication Data

US 2015/0162253 A1   Jun. 11, 2015

(51) Int. Cl.
*H05K 1/00* (2006.01)
*H01L 23/053* (2006.01)
(Continued)

(52) U.S. Cl.
CPC .............. *H01L 23/053* (2013.01); *B23Q 3/18* (2013.01); *H01L 21/481* (2013.01);
(Continued)

(58) Field of Classification Search
CPC .......... B23Q 3/18; H05K 1/02; H01L 21/481; H01L 21/764; H01L 21/4803; H01L 21/02104; H01L 21/76224; H01L 21/76264; H01L 21/76283; H01L 23/08; H01L 23/13; H01L 23/34; H01L 23/053; H01L 23/147; H01L 23/498; H01L 29/7842; H01L 29/66772; H01L 29/78621; H01L 29/78639; H01L 29/78687; H01L 29/78696; H01L 2924/00; H01L 2924/0002; Y10T 428/13

USPC ........ 174/250, 255, 251; 257/288, 501, 506, 257/508, 513, 522, 524, 770, E21.415, 257/E21.563, E21.564, E29.278,
(Continued)

(56) References Cited

U.S. PATENT DOCUMENTS 5,227,658 A  * 7/1993 Beyer .................... H01L 21/764
257/508
5,972,758 A   10/1999 Liang
(Continued)

OTHER PUBLICATIONS

C. Contiero et al., Progress in Power ICs and MEMS, Analog Technologies to interface the Real World, Proceedings of 2004 international symposium on power semiconductor devices & ICs, Kitakyushu, pp. 3-12.
(Continued)

*Primary Examiner* — Timothy Thompson
*Assistant Examiner* — Guillermo Egoavil
(74) *Attorney, Agent, or Firm* — Viering, Jentschura & Partner mbB

(57) ABSTRACT

According to various embodiments, a carrier may be provided, the carrier including: a hollow chamber spaced apart from a surface of the carrier; a trench structure extending from the surface of the carrier to the hollow chamber and laterally surrounding a first region of the carrier, the trench structure including one or more trenches extending from the surface of the carrier to the hollow chamber, and one or more support structures intersecting the one or more trenches and connecting the first region of the carrier with a second region of the carrier outside the trench structure, wherein the one or more support structures including an electrically insulating material.

8 Claims, 12 Drawing Sheets

(51) Int. Cl.
*B23Q 3/18* (2006.01)
*H01L 21/48* (2006.01)
*H01L 23/08* (2006.01)
*H01L 23/498* (2006.01)
*H01L 23/13* (2006.01)
*H01L 23/14* (2006.01)
*H01L 23/34* (2006.01)

(52) U.S. Cl.
CPC .......... *H01L 21/4803* (2013.01); *H01L 23/08* (2013.01); *H01L 23/13* (2013.01); *H01L 23/147* (2013.01); *H01L 23/34* (2013.01); *H01L 23/498* (2013.01); *H01L 2924/0002* (2013.01)

(58) Field of Classification Search
USPC ..... 257/E29.284, E29.298; 269/287; 427/77, 427/98.8; 428/34.1; 438/151
See application file for complete search history.

(56) References Cited

U.S. PATENT DOCUMENTS

| | | | |
|---|---|---|---|
| 6,433,401 B1 * | 8/2002 | Clark | B81C 1/00246 257/510 |
| 7,173,192 B1 | 2/2007 | Griese et al. | |
| 7,235,456 B2 | 6/2007 | Sato et al. | |
| 7,589,995 B2 | 9/2009 | Tang et al. | |
| 8,268,698 B2 | 9/2012 | Henson et al. | |
| 8,481,400 B2 | 7/2013 | Kautzsch et al. | |
| 2004/0026761 A1 * | 2/2004 | Leonardi | H01L 21/76264 257/506 |
| 2005/0062080 A1 * | 3/2005 | Nakamura | H01L 29/66772 257/288 |
| 2005/0218755 A1 | 10/2005 | Song et al. | |
| 2006/0131651 A1 * | 6/2006 | Sato | B82Y 20/00 257/347 |
| 2006/0138541 A1 * | 6/2006 | Nakamura | H01L 29/66772 257/347 |
| 2006/0194410 A1 * | 8/2006 | Sugaya | H01L 21/76286 438/424 |
| 2007/0023899 A1 | 2/2007 | Yudasaka | |
| 2007/0085131 A1 * | 4/2007 | Matsuo | H01L 29/0657 257/315 |
| 2008/0095531 A1 | 4/2008 | Yeo et al. | |
| 2008/0158649 A1 | 7/2008 | Park et al. | |
| 2010/0078757 A1 | 4/2010 | Eun | |
| 2011/0133186 A1 * | 6/2011 | Barlocchi | H01L 21/76264 257/48 |
| 2013/0001682 A1 * | 1/2013 | Tang | H01L 21/84 257/331 |
| 2013/0020718 A1 * | 1/2013 | Chou | B81B 3/0018 257/774 |
| 2013/0134530 A1 * | 5/2013 | Kautzsch | B81C 1/00158 257/417 |

OTHER PUBLICATIONS

Sato et al., Fabrication of Silicon-on-Nothing Structure by Substrate Engineering Using the Empty-Space-in-Silicon Formation Technique, Japanese Journal of Applied Physics, vol. 43, No. 1, 2004, pp. 12-18.

* cited by examiner

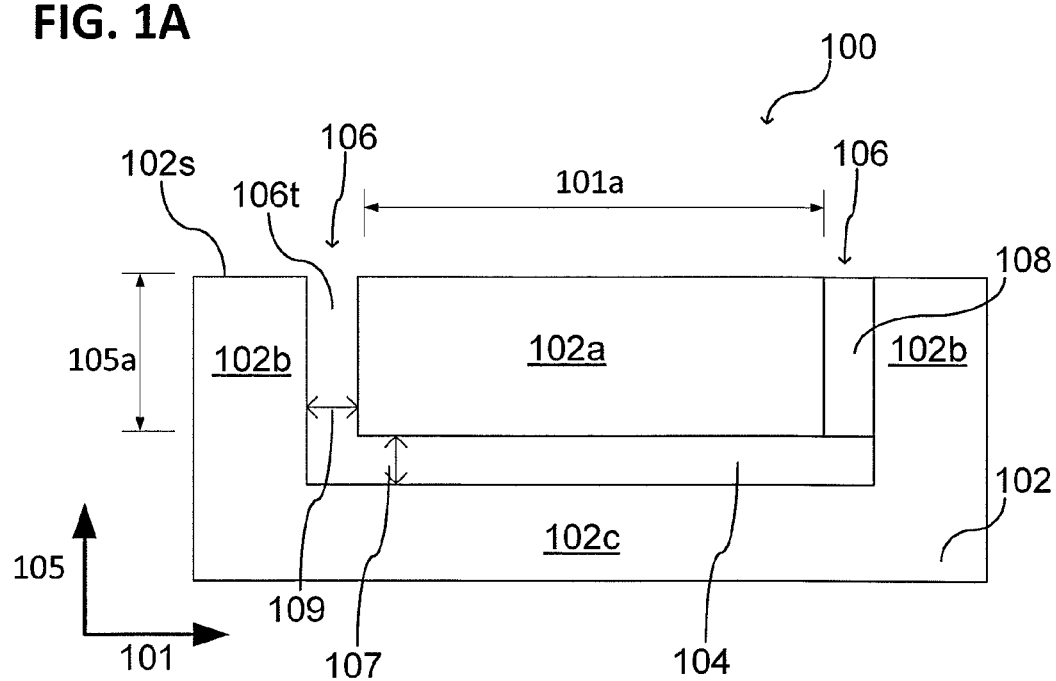
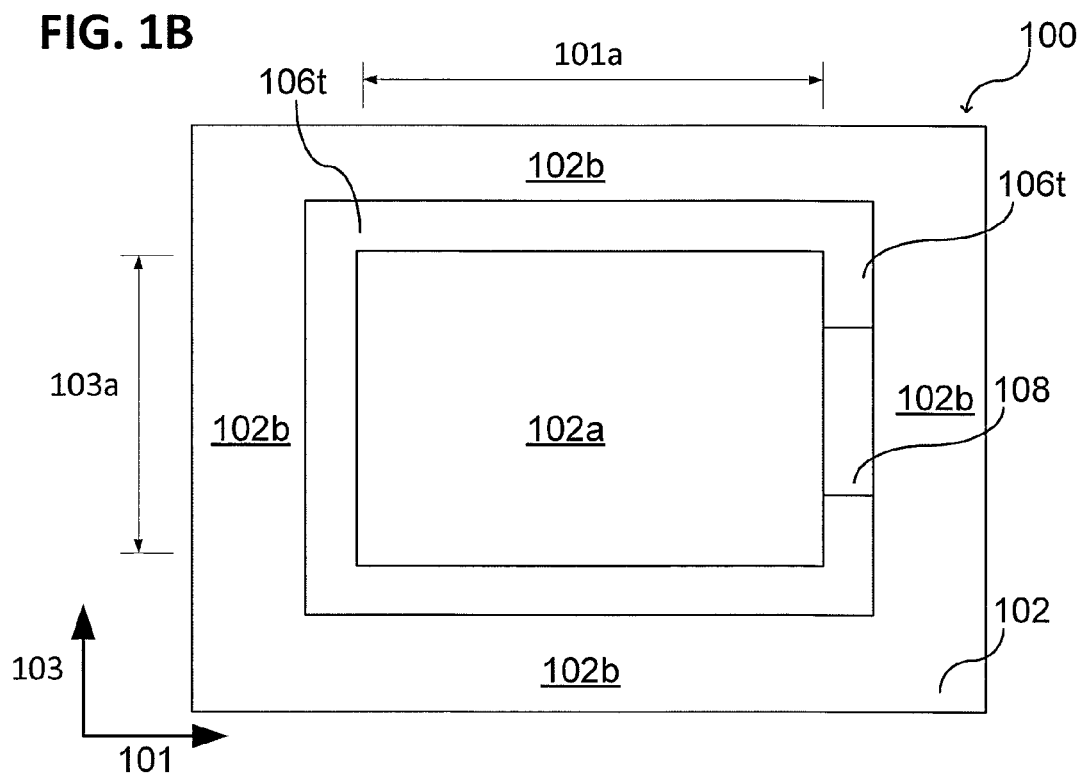

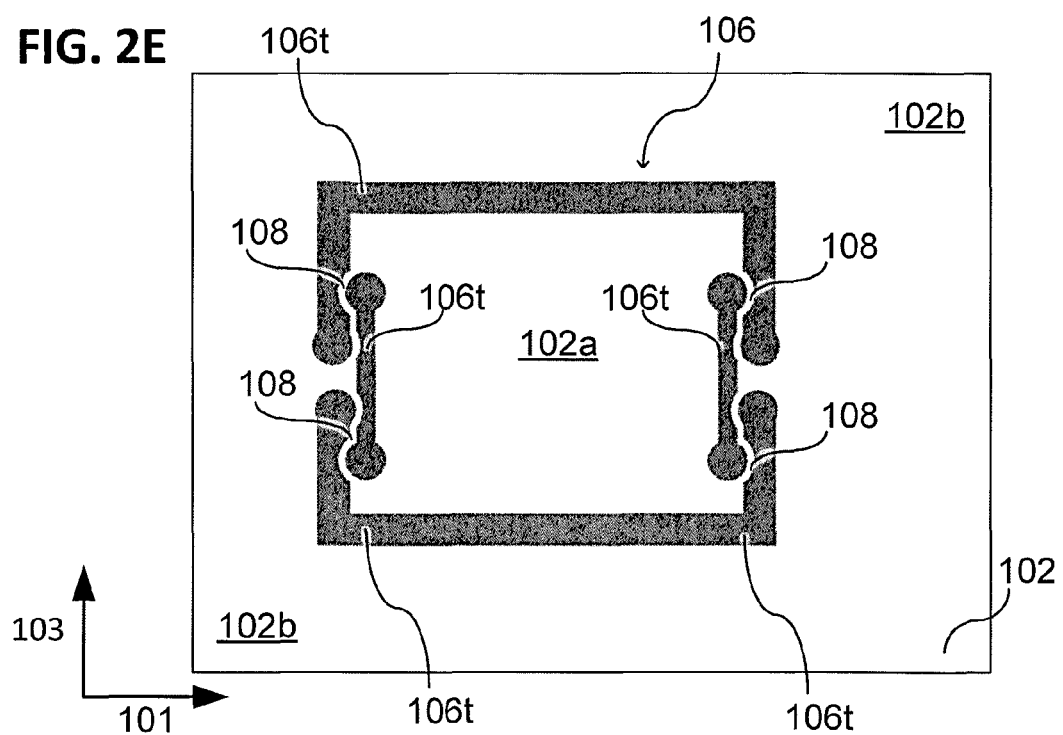

CARRIER AND A METHOD FOR PROCESSING A CARRIER

TECHNICAL FIELD

Various embodiments relate generally to a carrier and a method for processing a carrier.

BACKGROUND

In general, there are a variety of applications in microelectronics, microsystems, biomedical, and other fields for thin chips or ultra-thin chips to be formed for example on a carrier having a thickness in the range of about several tens of micrometers. Further, various processes may be utilized for providing an electrically isolated region in a carrier. Commonly used processes may allow for example forming a so-called silicon on insulator (SOI) structure or silicon on nothing (SON) structure, wherein a thin silicon region may be separated from the carrier. The silicon on insulator technology may include for example forming a buried oxide layer within a carrier and thereby providing an electrically isolated thin silicon region over the buried oxide layer. A silicon on nothing structure may be provided by applying a so-called empty space in silicon technique. However, applying commonly used processes for manufacturing an electrically isolated carrier region may for example, firstly, entail high costs for providing the specific structures in the carrier and, secondly, the complex processes may be prone to errors resulting for example in defect structures.

SUMMARY

According to various embodiments, a carrier may be provided, the carrier including: a hollow chamber spaced apart from a surface of the carrier; a trench structure extending from the surface of the carrier to the hollow chamber and laterally surrounding a first region of the carrier, the trench structure including one or more trenches extending from the surface of the carrier to the hollow chamber, and one or more support structures intersecting the one or more trenches and connecting the first region of the carrier with a second region of the carrier outside the trench structure, wherein the one or more support structures include an electrically insulating material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A shows a schematic cross sectional view or side view of a carrier, according to various embodiments;

FIG. 1B shows a schematic top view of a carrier, according to various embodiments;

FIGS. 2A to 2E show respectively a top view of a carrier, according to various embodiments;

DESCRIPTION

Figure 1C:
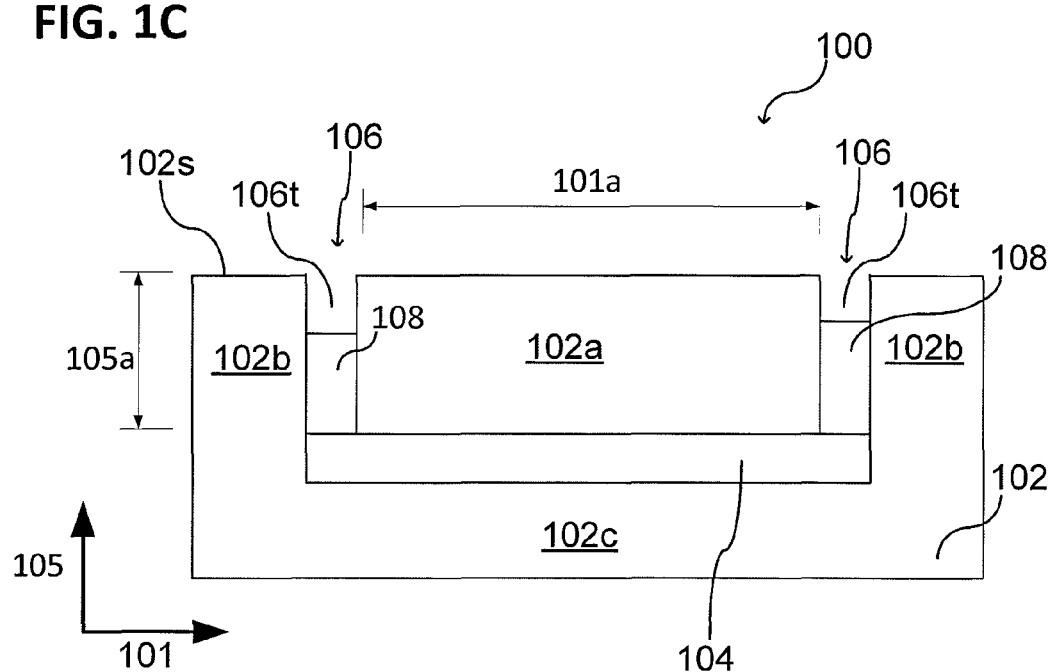
FIG. 1C shows a schematic cross sectional view or side view of a carrier, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface or deposit a layer "over" a carrier, may be used herein to mean that the deposited material may be formed "directly on", e.g. in direct contact with, the implied side, surface, or carrier. The word "over" used with regards to a deposited material formed "over" a side or surface or to deposit a layer "over" a carrier, may be used herein to mean that the deposited material may be formed "indirectly on" the implied side, surface, or carrier with one or more additional layers being arranged between the implied side, surface, or carrier and the deposited material.

The term "lateral" used with regards to the "lateral" extension of a structure (or of a carrier), a "lateral" direction, or "laterally" adjacent, may be used herein to mean an extension along a direction parallel to a surface of a carrier or a direction parallel to a surface of a carrier. That means, a surface of a carrier (e.g. a surface of a substrate, or a surface of a wafer) may serve as reference, commonly referred to as the main processing surface of a carrier (or the main processing surface of another type of carrier). Further, the term "width" used with regards to a "width" of a structure (or of a structure element, e.g. a cavity, e.g. a hollow chamber) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). Further, the term "depth" used with regards to a depth of a recess (or of a structure element), may be used herein to mean an extension of a recess (or of a structure element) along a direction perpendicular to the surface of a carrier (e.g. perpendicular to the main processing surface of a carrier). Further, a "vertical" structure may refer to a structure extending in a direction perpendicular to the lateral direction (e.g. perpendicular to the main processing surface of a carrier) and a "vertical" extension may refer to an extension along a direction perpendicular to the lateral direction (e.g. an extension perpendicular to the main processing surface of a carrier).

The word "cover" used with regards to deposited material covering a structure (or a structure element), may be used herein to mean that a deposited material may cover a structure (or a structure element) completely, e.g. covering all exposed sides and surfaces of a structure. The word "cover" used with regards to deposited material covering a structure (or a structure element), may be used herein to mean that the deposited material may cover a structure at least partially, e.g. a material may at least partially cover the exposed sides and surfaces of a structure.

According to various embodiments, a hollow chamber may for example be also filled with a material, e.g. a hollow chamber in a silicon wafer may be filled or partially filled with silicon oxide. Therefore, the term "hollow" used with regards to a "hollow" chamber may be used herein to mean that the hollow chamber itself (e.g. a cavity, e.g. a void, e.g. a hollow structure) may be free of material. However, a hollow chamber may be partially filled with a filling material, or may be completely filled with a filling material. Referring to this, the hollow chamber may be partially filled or completely filled with another material than the material providing the hollow chamber.

According to various embodiments, forming a layer (e.g. depositing a layer, depositing a material, and/or applying a layering process) as described herein may also include forming a layer, wherein the layer may include various sub-layers, whereby different sub-layers may include different materials respectively. In other words, various different sub-layers may be included in a layer, or various different regions may be included in a deposited layer and/or in a deposited material.

According to various embodiments, a method for processing a carrier, as described herein, may include several basic semiconductor manufacturing techniques which may be used at least once in the overall manufacturing process or at least once in at least once during processing of a carrier. The following description of basic techniques should be understood as illustrating examples, which techniques may be included in the processes described herein. The exemplarily described basic techniques may be not necessarily need to be construed as preferred or advantageous over other techniques or methods, since they only serve to illustrate how one or more embodiments may be practiced. For sake of brevity, the illustration of exemplarily described basic techniques may be only a short overview and should not be considered as exhaustive specification.

According to various embodiments, a layering process (or layering) may be included in a method for processing a carrier or in another process or method described herein. In a layering process, a layer may be deposited over a surface (e.g. over a carrier, over a wafer, over a substrate, over another layer, or the like) using deposition techniques, which may include chemical vapor deposition (CVD, or a CVD process) and physical vapor deposition (PVD, or a PVD process), according to various embodiments (a layering process may therefore include depositing a material). According to various embodiments, the thickness of a deposited layer may be in the range of a few nanometers up to several micrometers depending on its specific function. Further, according to various embodiments, a layer may include at least one of an electrically insulating material, an electrically semiconducting material, and an electrically conductive material, depending on the respective specific function of the layer. According to various embodiments, modifications of PVD and CVD processes may be used in the method for processing a carrier, e.g. for depositing an electrically insulating layer or filling a hollow structure with an electrically conductive material.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer deposition (ALD), atomic layer CVD (ALCVD), vapor phase epitaxy (VPE), metal organic CVD (MOCVD), hybrid physical CVD (HPCVD), and the like. According to various embodiments, a layering process may further include forming a resist layer or depositing a resist layer, e.g. using spin coating, spray coating, and the like.

According to various embodiments, a patterning process (or patterning) may be included in a method for processing a carrier or in another process or method described herein. The patterning process may include for example removing selected portions of a surface layer and/or removing selected portions of a material. According to various embodiments, a plurality of trenches, recesses and/or holes may be formed in a carrier or in a surface layer of a carrier using a patterning process. Further, patterning a layer may be used to form a patterned layer, e.g. a mask layer. Since a plurality of processes may be involved, according to various embodiments, there are various possibilities to perform a patterning process, wherein aspects may be: selecting at least one portion of a surface layer (or of a material or of a carrier) which shall be removed, e.g. using at least one lithographic process; and removing the selected portions of a surface layer, e.g. using at least one etch process.

According to various embodiments, a variety of lithographic processes may be applied to generate a mask layer (e.g. a patterned resist layer), for example photolithography, microlithography or nanolithography, electron beam lithography, X ray lithography, ultraviolet lithography, extreme ultraviolet lithography, interference lithography, and the like. A lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer).

According to various embodiments, an initial cleaning process or a cleaning process, which may be included in a lithographic process, may be applied to remove organic or inorganic contaminations from a surface (e.g. from a surface layer, from a carrier, from a wafer, and the like) by for example wet chemical treatment. According to various embodiments, a cleaning process (e.g. chemical mechanical polishing (CMP)) may also be applied to remove an oxide layer (e.g. a thin silicon oxide layer) from a surface (e.g. from a surface layer, from a carrier, or from a wafer, and the like).

According to various embodiments, applying a metallization process may further include a planarization of the carrier surface (wafer surface, substrate surface, and the like) and/or a planarization of intermediate layers included in a multilevel metallization process (e.g. using chemical mechanical polishing).

According to various embodiments, a planarization process may be applied as for example to reduce the surface roughness or the reduced variations in the depth profile of a carrier or a wafer surface including structure elements having different heights, since some processes may require a flat surface (a planar surface) (e.g. high resolution lithography). According to various embodiments, a planarization process may be necessary as the number of performed layering processes and patterning processes increases and as a planar surface may be required. According to various embodiments, a chemical mechanical polishing process (CMP or CMP process) may be performed, wherein this process may be selective to specific materials on the surface of a carrier (of a wafer, substrate, surface layer, and the like). According to various embodiments, a chemical mechanical polishing process (CMP) may be performed, wherein this process may be non-selective to specific materials on the surface of a carrier (of a wafer, substrate, surface layer, and the like). According to various embodiments, a planarization process may be included additionally in several processes, e.g. in layering processes, patterning processes, and the like.

According to various embodiments, a resist may be applied to cover a surface (e.g. a surface layer, a carrier, or a wafer, and the like). According to various embodiments, applying a resist may include spin coating or spray coating to generate a resist layer. According to various embodiments, a resist may be exposed (e.g. by exposing a resist to a pattern of light) to transfer a desired pattern to a resist, e.g. using light or electrons, wherein the desired pattern may be defined by a patterned lithographic mask (e.g. a glass carrier with a patterned chromium layer used for exposing the resist layer).

According to various embodiments, a lithographic process may include developing a resist (e.g. developing a photoresist using a photoresist developer) to partially remove the resist to generate a patterned resist layer (e.g. on a surface layer or on a carrier, a wafer, and the like). According to various embodiments, the developing process may include a special chemical solution (a so called developer) as for example sodium hydroxide or tetramethylammonium hydroxide (TMAH, a metal ion free developer). According to various embodiments, the patterned resist layer may be solidified in a hard bake process (a heat treatment, e.g. rapid thermal processing), realizing a more durable protecting layer for later processes.

Independently of the described lithographic processes, a resist layer or a patterned resist layer may be removed completely (or partially) at a desired processing stage (e.g. after a trench has been etched or a carrier has been patterned) in a so called resist strip process. According to various embodiments, a resist may be removed chemically and/or by using oxygen plasma.

It should be noted, that a lithographic process, including for example exposing a resist and developing a resist may also be considered as a patterning process, wherein a patterned resist layer (a soft mask, or a resist mask) may be generated by the lithographic process. Further, according to various embodiments, subsequently using an etch process a pattern can be transferred from a patterned resist layer to a prior deposited or grown layer, wherein the previously deposited or grown layer may include a hard mask material as for example an oxide or a nitride (e.g. silicon oxide, e.g. silicon nitride) creating a so-called hard mask.

According to various embodiments, an etch process, which may be included in a patterning process, may be applied to remove material from a previously deposited layer, a grown surface layer, or from a carrier (or substrate, or wafer), and the like. According to various embodiments, a patterned layer of a hard mask material may serve as a mask for processes like etching or forming recesses, trenches, or holes at desired positions into a carrier or into a surface layer. Further, according to various embodiments, a patterned photoresist may also serve as a mask (a so called soft mask). The mask material may usually be selected with regard to specific needs as for example chemical stability or mechanical stability, e.g. to protect regions from being etched, or to define the shape of structure elements to be generated during a layering process, and the like.

According to various embodiments, some stages during processing a carrier may require a conformally deposited layer or may require conformally depositing a layer (e.g. for forming a layer over a sidewall of a structure element or covering an inner sidewall or surface of a cavity), which means that a layer (or a material forming a layer) may exhibit only small thickness variations along an interface with another body, e.g. a layer may exhibit only small thickness variations along edges, steps or other elements of the morphology of the interface. According to various embodiments, layering processes such as plating, atomic layer deposition (ALD), or several CVD processes (e.g. ALCVD, or LPCVD) may be suitable to generate a conformal layer or a conformally deposited layer of a material. According to various embodiments, using for example an atomic layer deposition (ALD) process, a structure having a high aspect ratio (e.g. larger than 5, e.g. larger than 10, e.g. larger than 20) may be conformally covered with a layer or thin film. Further, according to various embodiments, using for example an atomic layer deposition (ALD) process, the inner sidewall or sidewalls of a cavity or of a hollow chamber may be covered (completely or partially) with a conformal layer or a conformal thin film. In other words, using atomic layer deposition may allow coating the inner sidewall or sidewalls of a cavity or a cavity structure with a material layer (e.g. with a conformal material layer), if the cavity or the cavity structure may have at least one opening such that the material forming the material layer may reach the interior of the cavity or the cavity structure. Further, using atomic layer deposition may allow filling a hollow chamber completely, e.g. if the hollow chamber has at least one opening.

According to various embodiments, a carrier, as described herein, (e.g. a substrate, a wafer, and the like) may be made of semiconductor materials of various types, including silicon, germanium, Group III to V or other types, including polymers, for example, although in another embodiment, other suitable materials can also be used. In an embodiment, the wafer substrate is made of silicon (doped or undoped). As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs). According to various embodiments, the carrier may include one or more doped regions, e.g. providing one or more p-n-junctions in the carrier.

According to various embodiments, a method for processing a carrier is described, wherein this method may be used to form an electrically isolated region in a silicon wafer or silicon carrier, an SOI-structure (silicon-on-insulator structure). Further, according to various embodiments, a carrier may be provided including a separated silicon region (e.g. electrically isolated and/or spatially separated silicon region) in a carrier, an SON-structure (silicon-on-nothing structure). Commonly used technologies including an electrically isolated a region in the carrier may include for example utilizing an SOT-substrate (a silicon-on-insulator substrate), wherein a buried oxide layer (e.g. in a depth of several micrometers) electrically isolates a thin active silicon layer at the surface of the substrate. Using an SOI-substrate for manufacturing an electronic device may be an expensive option for realizing an electrically isolated region in the carrier. Another option may be the formation of a local buried oxide layer, a local SOI-region, e.g. by applying a so-called silicon-on-nothing-process (also called venezia process or venetia process) or the so-called empty space in silicon technique. Referring to this, an electrically isolated region may be formed in the carrier by forming a trench structure and performing a high temperature process to form a planar cavity or a tube-like cavity from the trench structure. Illustratively, the trench structure may be transformed via an annealing process into one or more cavities (hollow chambers) depending on the design of the trench structure. As a result, a local (laterally limited) isolation may be provided below a silicon region by the one or more cavities. In a further process, the region over the one or more cavities may be isolated laterally, e.g. by etching a trench into the carrier and filling the trench with a material. However, commonly used carrier designs and silicon-on-nothing processes may not allow forming a cavity with a large lateral extension, e.g. larger than several tens of micrometers, due to the complex diffusion and/or migration based forming process.

In general, a commonly used silicon-on-nothing-process for forming an electrically isolated region in the carrier may be prone to problems regarding the stability of the process and/or the mechanical stability of the processed structures. A commonly processed silicon-on-nothing structure (e.g. a separated silicon region or an electrically isolated silicon region in the carrier) may be connected to the rest of the carrier by reaming carrier material between buried tube-like cavities below the separated silicon region. The reaming carrier material between respectively two adjacent cavities may provide a mechanical support for the silicon region located over the plurality of cavities. Illustratively, the mechanical support for the isolated silicon region may be provided by forming a plurality of cavities in a defined distance to each other, wherein the material between the adjacent cavities of the plurality of cavities may be thermally oxidized. However, it may be difficult to generate such (e.g. buried tube-like) cavities, since the supports between adjacent cavities may need a precisely controlled width; since, firstly, a too small width of a support may reduce the stability of the venezia structure (of the silicon region located over the plurality of cavities) and further, the support may be completely removed by typically occurring small process fluctuations, and, secondly, a too large width of the support may cause a non-tolerable bow of the carrier during thermally oxidizing the supports to realize the electrical isolation of the silicon region above the cavities carried by the supports. If the support below the silicon region is processed under process conditions outside a very narrow windows of optimal process conditions (e.g. due to typically occurring process fluctuation), the silicon region may have no or a too weak connection to the carrier after a further trench structure may be formed for the lateral electrical isolation, and therefore, a further processing of the carrier may be impossible since the silicon region may be detached from the carrier.

Illustratively, providing the supports for a silicon on nothing structure below the separated silicon region by a plurality of tube-like cavities having a defined distance between each other may be associated with a precisely controlled processing which may be prone to errors and which may result in a low cost efficiency. Further, the thermal oxidation of the buried cavities may be difficult to control; the oxidation may be for example incomplete after a thermal oxidation process has been performed, such that undesired leakage currents may flow from the silicon region to the carrier. Further, the incomplete (partially) oxidizing of the buried cavities may cause a high input of mechanical stress into the carrier which may lead to an undesired bow of the carrier. Further, using buried structures to support the separated silicon region may result in the problem that it may be difficult or even impossible to perform a direct test, in order to determine whether the oxidation process was successful or not.

Various embodiments may provide a way to provide a separated silicon region (an SOI-structure or an SON-structure).

According to various embodiments, a silicon region may be provided in a carrier by forming a buried cavity (e.g. a planar cavity) to provide a local isolation of the silicon region from below; and the silicon region may be laterally isolated by forming an isolation trench structure including an isolation trench surrounding the silicon region, wherein the isolation trench may be interrupted, thereby providing one or more attaching structures laterally connecting the silicon region to a part of the carrier outside the trench structure.

Illustratively, the design of a lateral isolation trench structure for laterally isolating a silicon region in the carrier may include support structures (e.g. the support structures intersecting a circumferential isolation trench) extending laterally from the silicon region such that the silicon region may be isolated from below using for example a single cavity or a cavity without support structure. The support structures extending laterally from the silicon region to be isolated may be small enough to be oxidized partially or completely via a subsequently performed oxidation process (e.g. via a thermal oxidation). In other words, the support structures extending laterally from the silicon region to be isolated may include an oxide or may consist of an oxide, and therefore, the silicon region may be laterally electrically isolated via the trench structure.

According to various embodiments, lateral support structures may be utilized to electrically isolate a region in a carrier completely, wherein the region in the carrier may be isolated laterally via one or more trenches and vertically (from below) via one or more hollow chambers.

As described herein, a carrier design and a method may be provided for manufacturing a cost efficient SOI-structure or SON-structure via a stable process which may be easy to control. Thereby, support structures below the SOI-structure or SON-structure may not be necessary. Illustratively, the SOI-structure or SON-structure may have no load bearing vertical connection to the carrier.

According to various embodiments, the carrier may be used for manufacturing a cost efficient local SOI-structure or SON-structure with a uniformly extending hollow chamber (cavity) below the SOI-structure or SON-structure. This may be used in MEMS (micro-electromechanical systems) or in applications like resonators and integrated high voltage devices.

Further, the carrier design and the method for processing the carrier may be used for manufacturing an SOT-structure or an SON-structure for power applications, logic circuits, and/or MEMS on ultra-thin silicon. Thereby, an SOI-structure or an SON-structure may be formed in a carrier providing an ultra-thin chip and subsequently an electronic circuit or a MEMS may be formed on the ultra-thin chip, wherein the ultra-thin chip may be separated after processing via a plasma dicing process through the back-end-of-line stack with a subsequently performed Pick, Crack & Place™ process.

FIG. 1A illustrates a carrier 100 in a schematic side view or cross sectional view, according to various embodiments, wherein the carrier may include a hollow chamber 104 spaced apart from a surface 102s of the carrier 100. The carrier 100 may further include a trench structure 106 extending from the surface 102s of the carrier 100 to the hollow chamber 104 and laterally surrounding a first region 102a of the carrier 100, the trench structure 106 may include one or more trenches 106t extending from the surface 102s of the carrier 100 to the hollow chamber 104, and the trench structure 106 may further include one or more support structures 108 intersecting the one or more trenches 106t and connecting the first region 102a of the carrier 100 with a second region 102b of the carrier 100 outside the trench structure 106. Further, the one or more support structures 108 may include an electrically insulating material. In one or more embodiments, the one or more support structures 108 may be electrically insulating.

According to various embodiments, the carrier 100 may include a silicon substrate, a silicon carrier, or a silicon wafer. The carrier may further include another material; the carrier may be for example a layered carrier including at least a silicon layer as top layer. In other words, at least a surface layer 102 or surface region 102 of the carrier 100 may include silicon. The surface region 102 may be a part of the carrier 100. In one or more embodiments, the surface region 102 may be formed over a bulk region of the carrier 100. Alternatively, the carrier 100 may include or may be a semiconductor substrate, a semiconductor carrier, or a semiconductor wafer, including or being made of other semiconductor materials than silicon, e.g. germanium.

In one or more embodiments, the surface 102s may be an upper surface or top side of the carrier 100. The upper surface 102s of the carrier, for example of the surface layer 102, or of the surface region 102 of the carrier 100, may define a lateral direction 101. According to various embodiments, the hollow chamber 104 included in the carrier 100 may be formed within the surface region 102 of the carrier 100, wherein the hollow chamber 104 may be disposed spaced apart from the upper surface 102s. The distance 105a between the upper surface 102s and the hollow chamber 104, e.g. the vertical distance perpendicular to the lateral direction 101, may define the height 105a of the first region 102a of the carrier 100. The height 105a of the first region 102a of the carrier 100 may be in the range from about several hundreds of nanometers to about several micrometers or to about several tens of micrometers, e.g. in the range from about 100 nm to about 50 µm, e.g. in the range from about 1 µm to about 30 µm, e.g. in the range from about 1 µm to about 10 µm.

Further, the width 101a of the first region 102a of the carrier 100 may be limited by the width of the hollow chamber 104 (the hollow chamber 104 may laterally extend within the carrier 100). Referring to this, the width 101a of the first region 102a of the carrier 100 may be defined by the trench structure 106 laterally surrounding the first region 102a of the carrier 100. The width 101a of the first region 102a of the carrier 100 may be in the range from about several hundreds of nanometers to about several micrometers, or to about several tens of micrometers, or to about several hundreds of micrometers, or to about several millimeters, or to about several centimeters.

According to various embodiments, the width of the hollow chamber 104 may be the same as or larger than the width 101a of the first region 102a of the carrier 100.

According to various embodiments, the trench structure 106 or the one or more trenches 106t included in the trench structure 106 may extend from the surface 102s into the carrier 100 or into the surface region 102 of the carrier, e.g. having a depth being the same as or larger than the height 105a of the first region 102a of the carrier 100.

Further, the trench structure 106 or the one or more trenches 106t included in the trench structure 106 may extend from the surface 102s at least to the hollow chamber 104. In other words, the depth of the one or more trenches 106t may be solely limited by the processing of the one or more trenches 106t. According to various embodiments, the trench structure 106 or the one or more trenches 106t included in the trench structure 106 may laterally separate the first region 102a of the carrier 100 from a second region 102b of the carrier 100 surrounding the first region 102a of the carrier 100 (the second region 102b surrounding the trench structure 106). The width 109 of the one or more trenches 106t of the trench structure 106 may be in the range from about several tens of nanometers to about several micrometers, e.g. in the range from about 10 nm to about 10 µm, e.g. in the range from about 50 nm to about 1 µm.

According to various embodiments, the hollow chamber 104 may vertically separate the first region 102a of the carrier 100 from a third region 102c of the carrier 100, the third region 102c of the carrier 100 may be disposed or may extend below the first region 102a of the carrier 100. The hollow chamber 104 may be disposed between the first region 102a and the third region 102c of the carrier 100. The height 107 of the hollow chamber 104 may be in the range from about several tens of nanometers to about several micrometers, e.g. in the range from about 50 nm to about 10 µm, e.g. in the range from about 100 nm to about 1 µm.

According to various embodiments, the first region 102a of the carrier 100, the third region 102e of the carrier 100, and/or the second region 102b of the carrier 100 may include or may consist of silicon, e.g. doped silicon.

Further, the trench structure 106 may include a support structure 108, e.g. one or more support structure elements 108. The support structure 108 or the one or more support structure elements 108 may include or may consist of an electrically insulating material, e.g. an oxide, a nitride, or an oxynitride, e.g. silicon oxide, silicon nitride, or silicon oxynitride. According to various embodiments, the support structure 108 or the one or more support structure elements 108 may include silicon being at least partially oxidized, e.g. via a thermal oxidation process of a silicon structure being formed within the trench structure 106 or via thermally oxidizing a part of the trench structure 106.

Further, the support structure 108 or the one or more support structure elements 108 may be configured to be electrically insulating, e.g. at least along the lateral direction. According to various embodiments, the support structure 108 or the one or more support structure elements 108 may be in direct contact with the first region 102a of the carrier 100 and the second region 102b of the carrier 100, thereby connecting the first region 102a of the carrier 100 and the second region 102b of the carrier 100 with each other. Since the hollow chamber 104 may be configured to vertically separate the first region 102a of the carrier 100 from the third region 102c of the carrier 100, e.g. such that the first region 102a of the carrier 100 may not be in direct contact to the third region 102c of the carrier 100, the support structure 108 or the one or more support structure elements 108 may serve to or may be configured to hold (carry, fix) the first region 102a of the carrier 100. Illustratively, the first region 102a of the carrier 100 may have no direct contact to the rest of the carrier 100 or the rest of the surface region 102, wherein the first region 102a of the carrier 100 may be mechanically attached (or held) only by the support structure 108. Therefore, the first region 102a of the carrier 100 may be electrically isolated from the rest of the carrier 100 or the rest of the surface region 102 (wherein the rest of the carrier 100 may be regarded for example as the third region 102c and the second region 102b of the carrier 100). Further, the first region 102a of the carrier 100 may be connected to the second region 102b of the carrier 100 via at least one support structure 108, e.g. at least one side of the first region 102a of the carrier 100 may be attached to the corresponding adjacent side of the second region 102b of the carrier 100 via at least one support structure 108. There may be several possible modifications for connecting the first region 102a of the carrier 100 to the second region 102b of the carrier 100 via one or more support structures 108.

According to various embodiments, the hollow chamber 104 and the trench structure 106 including the one or more trenches 106t and the one or more support structures 108 (or support structure elements 108) may electrically separate (as well as spatially separate) the first region 102a of the carrier 100 from the rest of the carrier 100. Therefore, the first region 102a of the carrier 100 may be a silicon region on an insulator (the insulator may be in this case the spatial distance provided by the hollow chamber 104 and the one or more trenches 106t of the trench structure 106), which may be referred to as SOI. Further, the first region 102a of the carrier 100 may be a silicon region on nothing (wherein nothing may be in this case the spatial distance provided by the hollow chamber 104 and the one or more trenches 106t of the trench structure 106), which may be referred to as SON. Referring to this, the hollow chamber 104 may be free of a material, e.g. free of solid and/or liquid material, e.g. the hollow chamber 104 may be an empty space. Further, the one or more trenches 106t may be free of a material, e.g. free of solid and/or liquid material.

According to various embodiments, the one or more trenches 106t may have any desired shape or design (as for example illustrated in FIGS. 2A to 2F) and therefore, the one or more trenches 106t may be regarded as one or more recesses 106t, as one or more holes 106t, as one or more openings 106t, as one or more cavities 106t, and the like.

According to various embodiments, the inner walls of the hollow chamber 104 and/or the sidewalls of the one or more trenches 106t of the trench structure 106 may be covered with an additional material, e.g. with an electrically insulating material, e.g. with an oxide, e.g. with silicon oxide. However, the hollow chamber 104 and/or the one or more trenches 106t of the trench structure 106 may provide a gap between the first region 102a of the carrier 100 and the rest of the carrier. Illustratively, this gap completely confining the first region 102a of the carrier 100 may be (e.g. solely) interrupted (intermitted or bridged) by the support structure 108 or, as described in the following, by more than one support structure 108.

FIG. 1B shows a top view of the carrier 100 corresponding to the side view or cross sectional view shown in FIG. 1A. The carrier 100 or the surface region 102 of the carrier 100 may have a larger lateral extension than illustrated in the figures. The carrier 100 may be a silicon wafer having for example a diameter of up to 300 mm or a diameter even larger than 300 mm. Further, in analogy to the illustrated carrier 100, there may be a plurality of first regions disposed or formed in the carrier 100. According to various embodiments, a plurality of separated first regions 102a may be arranged in the carrier 100, e.g. laterally next to each other respectively surrounded by at least one trench structure 106.

As illustrated in FIG. 1B, the first region 102a may have a rectangular shape, seen from the top. Further, the first region 102a may have any other processable shape (e.g. using semiconductor patterning processes), e.g. a quadratic shape, a circular shape, a polygonal shape, and the like. According to various embodiments, the trench structure 106 may have a similar shape as the first region 102a, such that the trench structure 106 may laterally surround and laterally limit the first region 102a of the carrier 100.

The support structure 108 may extend vertically through the trench structure 106 or the one or more trenches 106t of the trench structure 106. In other words, the vertical extension of the support structure 108 may be the same as or larger than the height 105a of the first region 102a of the carrier 100. Alternatively, the vertical extension of the support structure 108 may be smaller than the height 105a of the first region 102a of the carrier 100 such that the support structure 108 may partially extend vertically through the trench structure 106 or through the one or more trenches 106t of the trench structure 106.

As illustrated, the trench structure 106 or the one or more trenches may extend vertically (or substantially vertically with a deviation of less than about 10°) into the carrier from the surface 102s to at least the hollow chamber 104. Alternatively, the trench structure 106 or the one or more trenches may extend in any other angle transversally to the surface 102s of the carrier 100.

As illustrated in FIG. 1C, at least two support structures 108 or support structure elements 108 may be configured to laterally attach the first region 102a of the carrier 100 to the second region 102b of the carrier 100. The support structures 108 may be arranged symmetrically on opposite sides of the first region 102a. Illustratively, a part of the trench structure 106 may be configured as support structure 108.

Figure 1D:
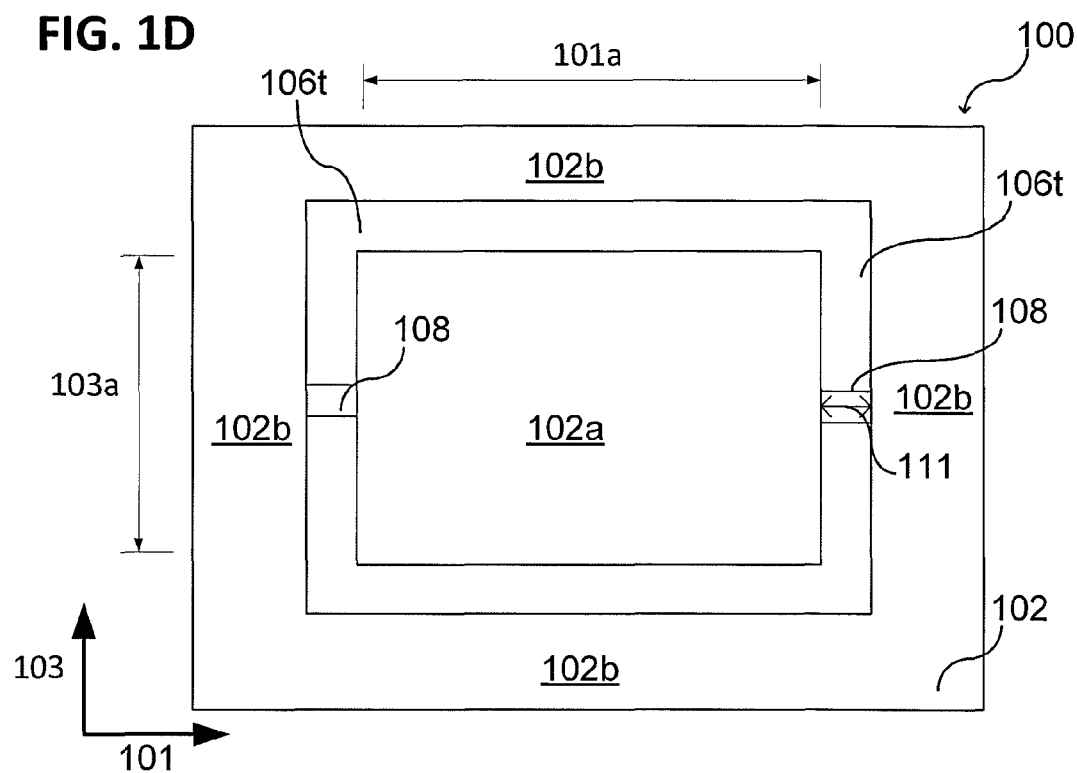
FIG. 1D shows a schematic top view of a carrier, according to various embodiments.

According to various embodiments, as illustrated in FIG. 1D, the support structures 108 may in each case connect the first region 102a to the second region 102b along a connecting direction 111, e.g. defined by the respective contact regions being in contact with the support structure 108. The extension of the support structure 108 along the connecting direction 111 may be in the range from about several tens of nanometers to about several micrometers, e.g. in the range from about 10 nm to about 10 µm. Illustratively, the extension of the support structure 108 along the connecting direction 111 may depend on the width 109 of the one or more trenches, therefore, the extension of the support structure 108 along the connecting direction 111 may be the same as or larger than the respective width 109 of the one or more trenches. Further, the extension of the support structure 108 transversally (vertically) to the connecting direction 111 may be smaller than about 300 nm, e.g. smaller than about 200 nm, e.g. smaller than about 100 mm, e.g. in the range from about 10 nm to about 100 nm. The extension of the support structure 108 transversally (vertically) to the connecting direction 111 may allow completely oxidizing the support structure 108 without damaging the SOI-structure or SON-structure. Illustratively, oxidizing a support structure 108 having a larger thickness than several tens or hundreds of nanometers might lead to a stress impact into the support structure 108 and/or into the first region 102a which may destroy the structure. Forming the trench structure 106 using a lithographic based patterning from the top of the carrier 100 may allow forming the support structure 108 having the desired dimensions.

According to various embodiments, a support structure 108 including for example silicon oxide may be structurally weaker than the same support structure 108 consisting of silicon, therefore, the first region 102a of the carrier 100 may be removed easily at any desired processing stage of a subsequently performed processing.

According to various embodiments, a subsequently performed processing may include forming an electronic circuit (or a micro-electromechanical system, or a sensor, or any other component being processable in semiconductor technology) over and/or in the first region 102a of the carrier 100. In one or more embodiments, a first electronic circuit (or micro-electromechanical system, sensor, or other component being processable in semiconductor technology) may be formed over and/or in the first region 102a of the carrier 100 and a second electronic circuit (or micro-electromechanical system, sensor, or other component being processable in semiconductor technology) may be formed over and/or in the second region 102b (or the third region 102c) of the carrier 100 outside the trench structure 106. Therefore, the trench structure 106 may laterally isolate a first electronic circuit (or micro-electromechanical system, sensor, or other component being processable in semiconductor technology) from a second electronic circuit (or micro-electromechanical system, sensor, or other component being processable in semiconductor technology).

According to various embodiments, a separation (or separating a first region in the carrier) may include an electrical isolation (or providing an electrical isolation) such that no significant current flow may be possible between the separated structures. Further, a separation may include a spatial separation, e.g. by providing a gap or an empty space.

Figure 1E:
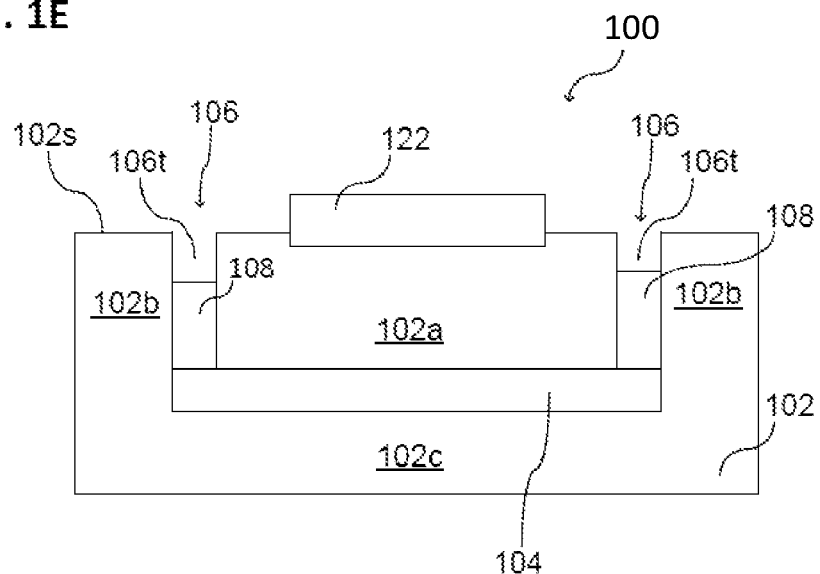
FIG. 1E shows a schematic cross sectional view or side view of a carrier, according to various embodiments.

For several reasons, as illustrated in FIG. 1E, it may be desired to form one or more components 122 (e.g. electronic circuits or electronic components and/or mechanical components) over and/or in the first region 102a of the carrier 100, wherein the one or more components 122 may be separated from the rest of the carrier, since the one or more components 122 (e.g. including a sensor, a switch, a logic circuit, a microprocessor, a MEMS, and the like) have to be operated for example under specific operating conditions. A low voltage or low power component 122 may be for example integrated into a power device, e.g. into an IGBT, a power MOSFET, and the like, wherein the low voltage or low power component 122 may be separated (e.g. via the trench structure 106 and the hollow chamber 104) from the power device being arranged in the rest of the carrier 100 (e.g. in the third region 102c and/or in the second region 102b.

Illustratively, the carrier 100 as described herein may allow providing a first electronic component and a second electronic component in a single carrier or in a single semiconductor substrate, wherein the two electronic components may need different operating conditions (e.g. operating voltages, operating currents, and the like), e.g. the carrier 100 may allow integrating a sensor (e.g. a temperature sensor) into a power electronic device to provide a direct measurement of the actual state of the power electronic device, integrating a current and/or voltage measurement structure into a power electronic device to determine the electronic properties of the power electronic device more accurately, and/or integrating a switch structure or a control circuit (e.g. a logic circuit) into a power electronic device to control the operation of the power electronic device.

According to various embodiments, a first electronic component (e.g. a sensor, a logic circuit, a switching circuit, a control circuit, and/or a measurement circuit) may be disposed or formed over and/or in the first region 102a of the carrier 100 and a second electronic component (e.g. a power electronic component, such as a diode, a bipolar junction transistor, an insulated gate bipolar transistor, a power MOSFET (a power metal oxide semiconductor (MOS) field-effect transistor (FET)), a thyristor, a gate turn-off thyristor, a MOS-controlled thyristor, an integrated gate-commutated thyristor (IGCT), and the like) may be disposed or formed over and/or in the third region 102c and/or second region 102b of the carrier 100. According to various embodiments, the second electronic component may be configured to operate at other operating conditions than the first electronic component, e.g. in a different voltage range and/or in a different current range. According to various embodiments, the second electronic component may be a semiconductor power component operating in a voltage range and/or current range being one or more orders of magnitude larger than the operating conditions of the first electronic component, e.g. the second electronic component may operate at voltages in a range from about 50 V to about 5000 V and/or currents in the range from about 50 A to about 5000 A, wherein the first electronic component may be a logic circuit or a sensor working at voltages lower than about 50 V and/or currents lower than about 50 A. The first electronic component (e.g. a logic circuit, a switching circuit, a measurement circuit, and/or a temperature sensor) may not readily withstand voltages and/or currents typically handled by a power electronic component, wherein the first electronic component and the second electronic component may be arranged adjacent to each other in a single carrier, therefore, according to various embodiments, the first electronic component may be separated from the second electronic component via an electrically insulating structure being arranged in the carrier (e.g. via the hollow chamber 104 and the trench structure 106).

Figure 1F:
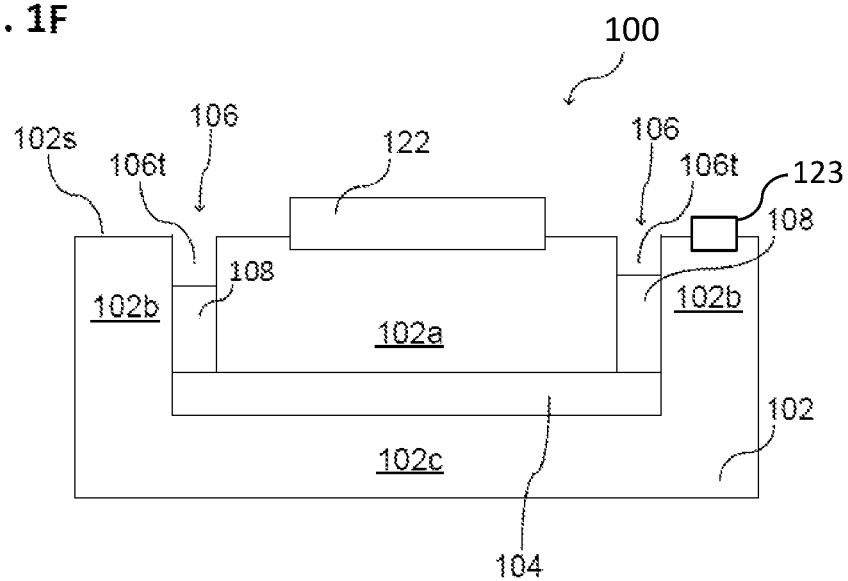
FIG. 1F shows a schematic cross sectional view or side view of a carrier, according to various embodiments.

According to the embodiment shown in FIG. 1F, the carrier 100 includes a first electronic component 122 formed over and/or in the first region 102a of the carrier 100 and a second electronic component 123 formed over and/or in the second region 102b of the carrier 100.

Further, according to various embodiments, the first electronic component may be electrically coupled to the second electronic component in order to analyze and/or control the second electronic component, e.g. via a metallization structure arranged over the carrier, wherein the first electronic component and the second electronic component may be at least partially formed in the carrier.

According to various embodiments, an electronic device may include a carrier 100 having a separated first region 102a, as described herein. The electronic device, as described herein, may provide an electronic control circuit being integrated into a power electronic component, the electronic control circuit may be configured to monitor and control the power electronic component such that the power electronic component may be designed according to other aspects, which may allow for example a smaller design obtaining the same properties as a common power electronic device and/or an enhanced functionality at the same size as a common power electronic device.

According to various embodiments, a high voltage device 122 may be integrated into the first region 102a of the carrier 100, wherein the high voltage device 122 is separated from the rest of the carrier 100 via the hollow chamber 104 and the trench structure 106.

According to various embodiments, a micromechanical or micro-electromechanical device 122 may be integrated into the first region 102a of the carrier 100, wherein the micromechanical or micro-electromechanical device 122 is separated from the rest of the carrier 100 via the hollow chamber 104 and the trench structure 106.

According to various embodiments, a sensor 122 or a sensor array 122 may be integrated into the first region 102a of the carrier 100, wherein the sensor or the sensor array is separated from the rest of the carrier 100 via the hollow chamber 104 and the trench structure 106.

Various modifications and/or configurations of the carrier 100 and details referring to the hollow chamber 104, the trench structure 106, and the support structure 108 are described in the following, wherein the features and/or functionalities described referring to FIGS. 1A to 1E may be included analogously. Further, the features and/or functionalities described in the following may be included in the carrier 100 or may be combined with the carrier 100, as described before referring to FIGS. 1A to 1E.

Figure 2A:
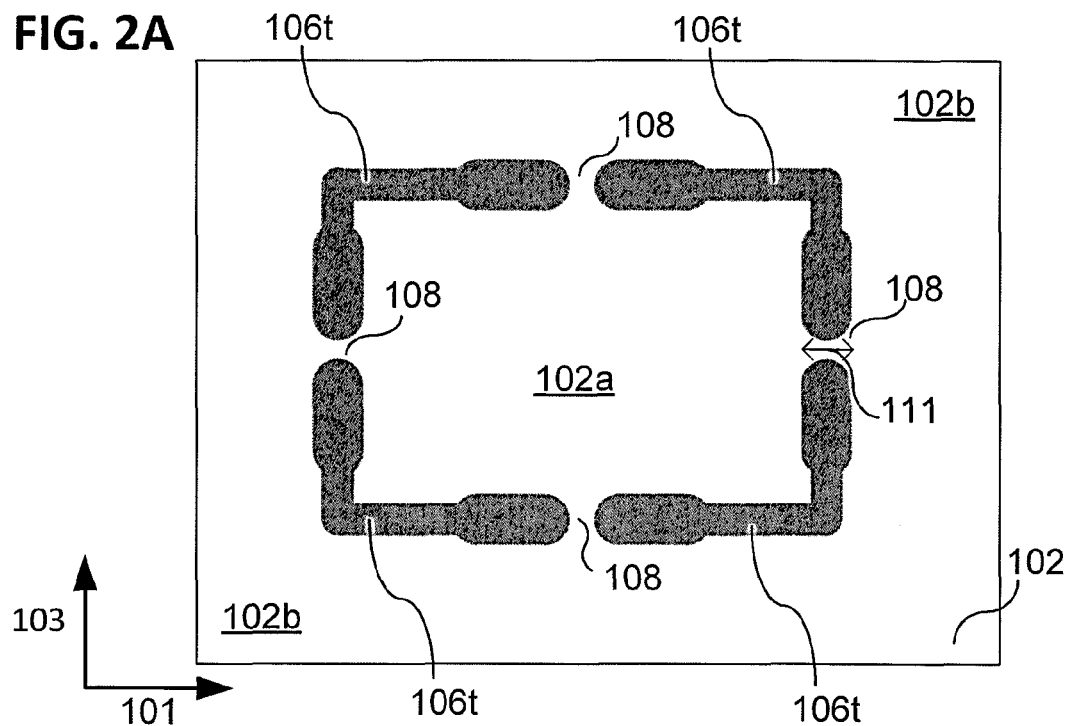
Figure 2B:
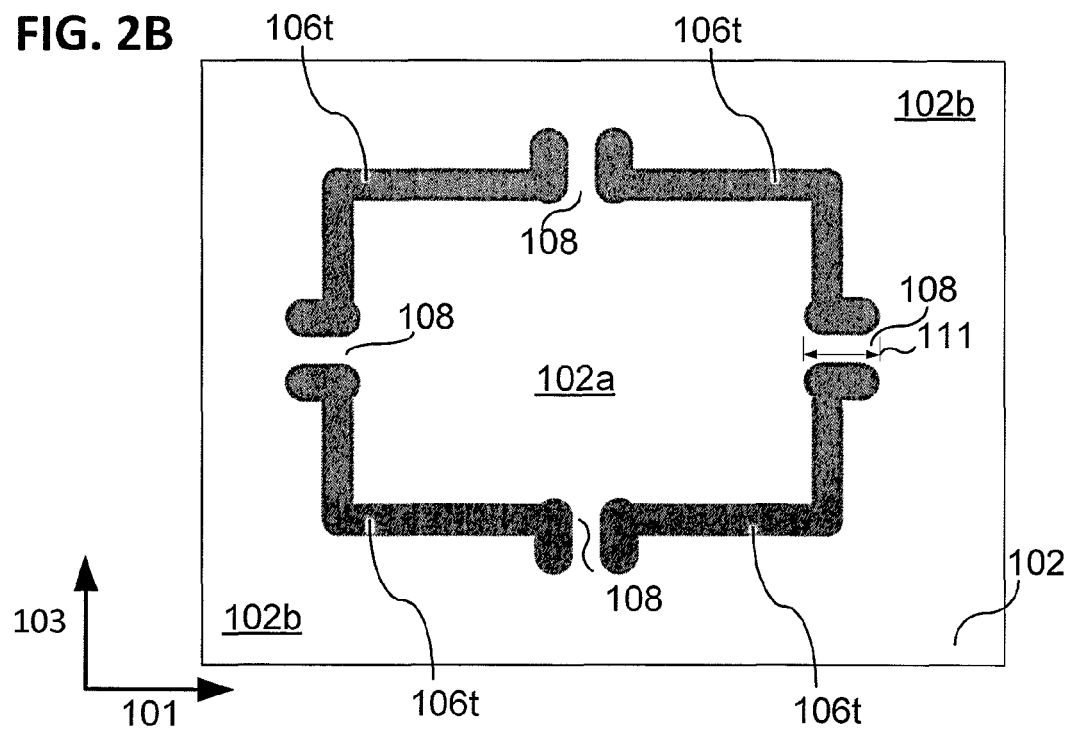

The following FIGS. 2A to 2E show respectively a schematic top view of the carrier 100 including respectively a different trench structure 106, according to various embodiments. The design of the trench structure 106 may be adapted or selected to provide the one or more trenches 106t and the one or more support structures 108 for separating (laterally isolating) at least one first region 102a of the carrier 100, as already described. As shown in FIG. 2A, the first region 102a of the carrier 100 may be attached via four support structures 108, each disposed at one side of the first region 102a. The extension of the support structure 108 along the connecting direction 111 may be defined by the patterning of the trench structure 106, e.g. by the design of the one or more trenches 106t. Illustratively, the extension of the support structure 108 along the connecting direction 111 may be adapted by using a corresponding arrangement of the one or more trenches of the trench structure 106, as for example illustrated in FIG. 2B.

Figure 2C:
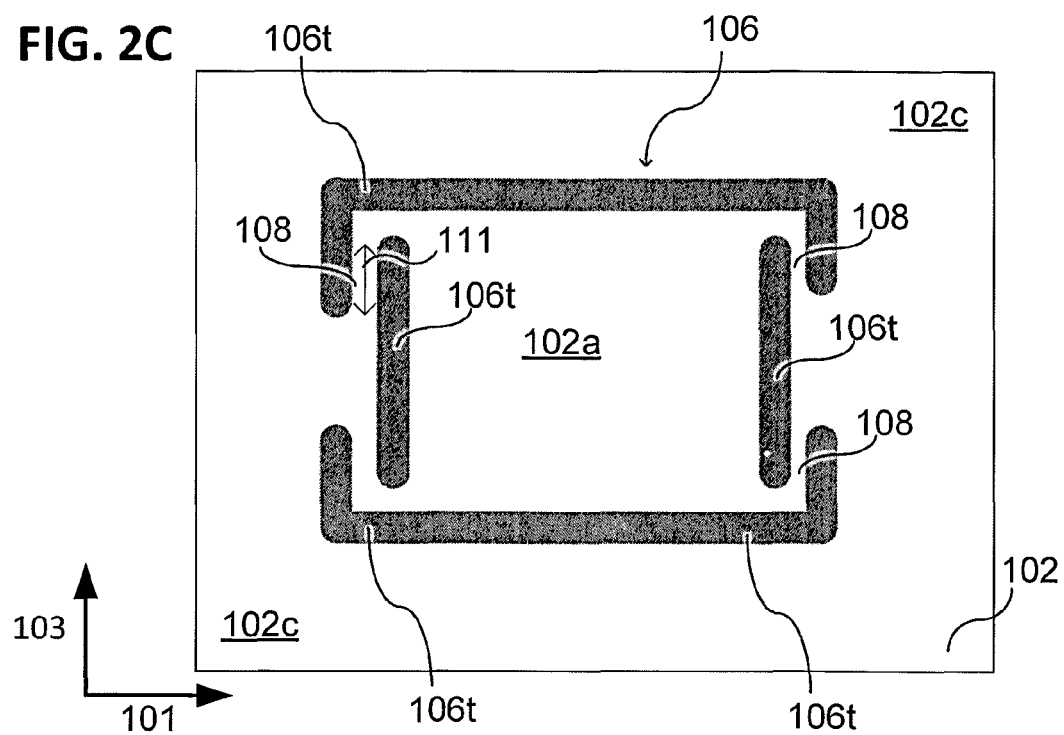

Further, as shown in FIG. 2C, the trench structure 106 may include a plurality of trenches 106t, wherein at least two trenches may be arranged such that the support structure 108 may be generated between the at least two trenches. As an example, FIG. 2C shows four trenches 106t, with two trenches 106t extending along a lateral direction 103 (which may be perpendicular to the lateral direction 101), and two trenches 106t having a central portion extending along the lateral direction 101 and end portions extending along the lateral direction 103.

Figure 2D:
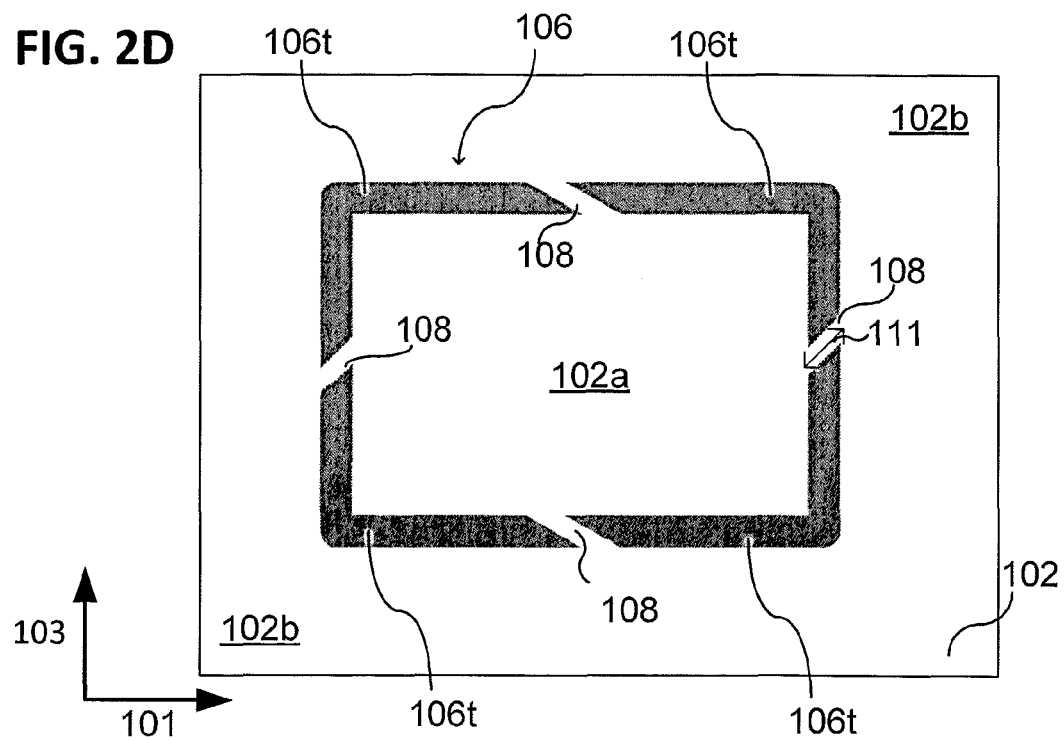

Further, as shown in FIG. 2D, the trench structure 106 may include a circumferential trench 106t (e.g. including several parts), wherein the trench 106t may be intersected via a plurality of support structures 108 extending obliquely to the trench 106t. In this configuration, oxidizing the silicon support structures 108 to form support structures 108 including an electrically insulating oxide (silicon oxide) may cause a rotating displacement of the first region 102a, since the support structure 108 may expand during the oxidation. Therefore, mechanical stress due to the formation of the silicon oxide may be released by allowing a movement (rotation) of the first region 102a. In this case, the rotation may be in the range of several degrees, e.g. smaller than 10°, such that the first region 102a may not contact the second region 102b directly.

According to various embodiments, the trench structure 106 may have a more complex design, as for example illustrated in FIG. 2E. Referring to this, the arrangement of the one or more trenches 106t of the trench structure 106, and therefore, the positions and the shapes of the support structures 108, may be limited by the patterning process utilized for forming the one or more trenches 106t.

According to various embodiments, the trench structure 106 may be processed by applying a mask material on the carrier (e.g. a hard mask material or a soft mask material), patterning the mask material forming a patterned mask, and etching the one or more trenches 106t into the carrier via the patterned mask, e.g. using an etch-process, e.g. an anisotropic etch process, thereby forming the trench structure 106.

Figure 2F:
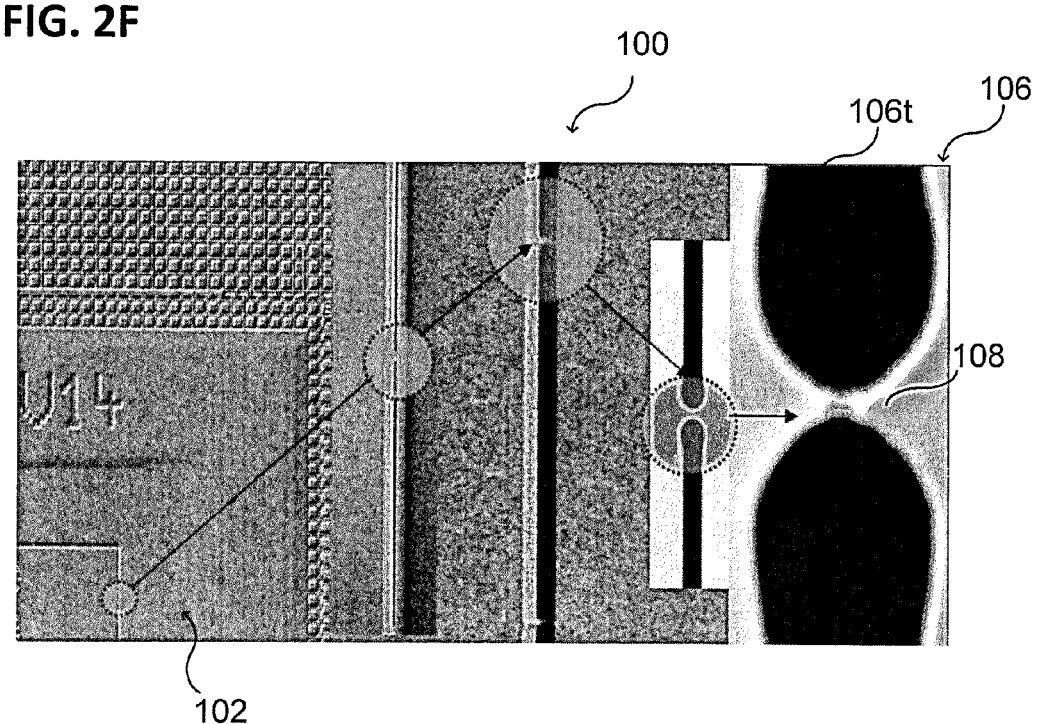
FIG. 2F shows a scanning electron microscopy image (SEM-image) of a carrier, according to various embodiments.

FIG. 2F shows a scanning electron microscopy image (SEM-image) of the surface 102s of a carrier 100, the carrier 100 including a trench structure 106, as described herein. The SEM-image contains five sub images having different magnification factors (increasing from left to right).

Figure 3:
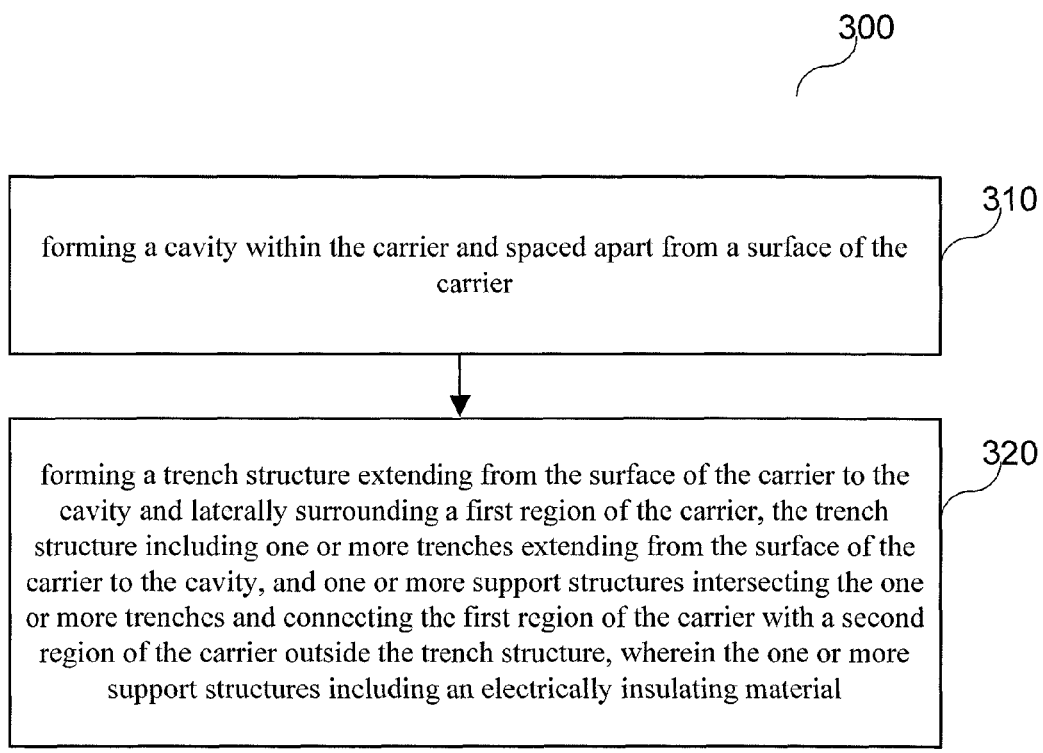
FIG. 3 shows a schematic flow diagram of a method for processing a carrier, according to various embodiments.

FIG. 3 shows a schematic flow diagram of a method 300 for processing a carrier 100, the method may include: in 310, forming a hollow chamber 104 within the carrier 100 and spaced apart from a surface 102s of the carrier 100; and, in 320, forming a trench structure 106 extending from the surface 102s of the carrier 100 to the hollow chamber 104 and laterally surrounding a first region 102a of the carrier 100, the trench structure 106 may include one or more trenches 106t extending from the surface 102s of the carrier 100 to the hollow chamber 104, and one or more support structures 108 intersecting the one or more trenches 106t and connecting the first region 102a of the carrier 100 with a second region 102b of the carrier 100 outside the trench structure 106, wherein the one or more support structures 108 may include an electrically insulating material.

Figure 4A:
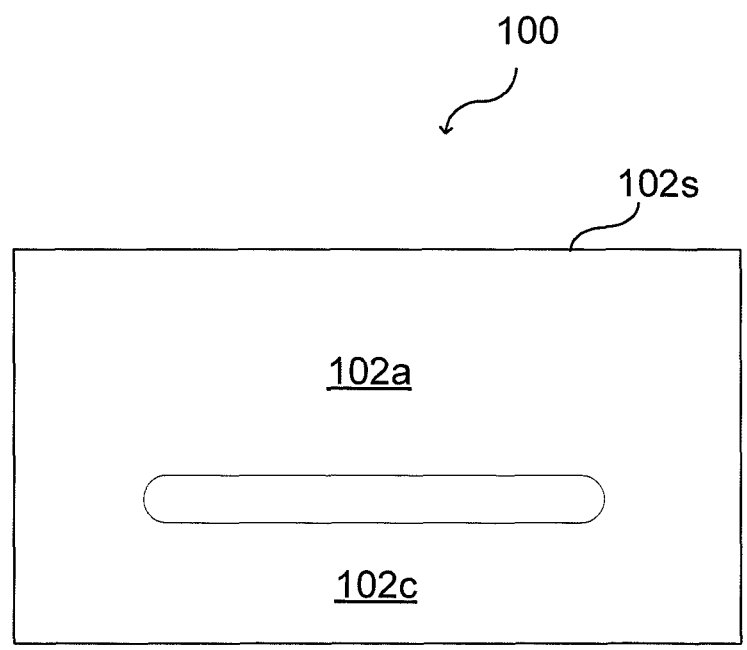
FIGS. 4A and 4B show respectively a cross sectional view or side view of a carrier during processing, according to various embodiments.
Figure 5A:
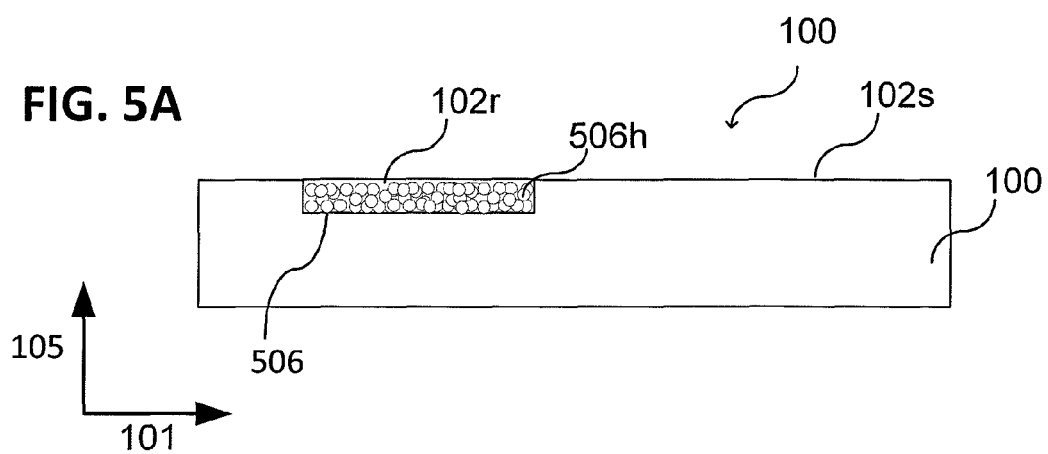
FIGS. 5A to 5C show respectively a cross sectional view or side view of a carrier during processing, according to various embodiments.
Figure 5B:
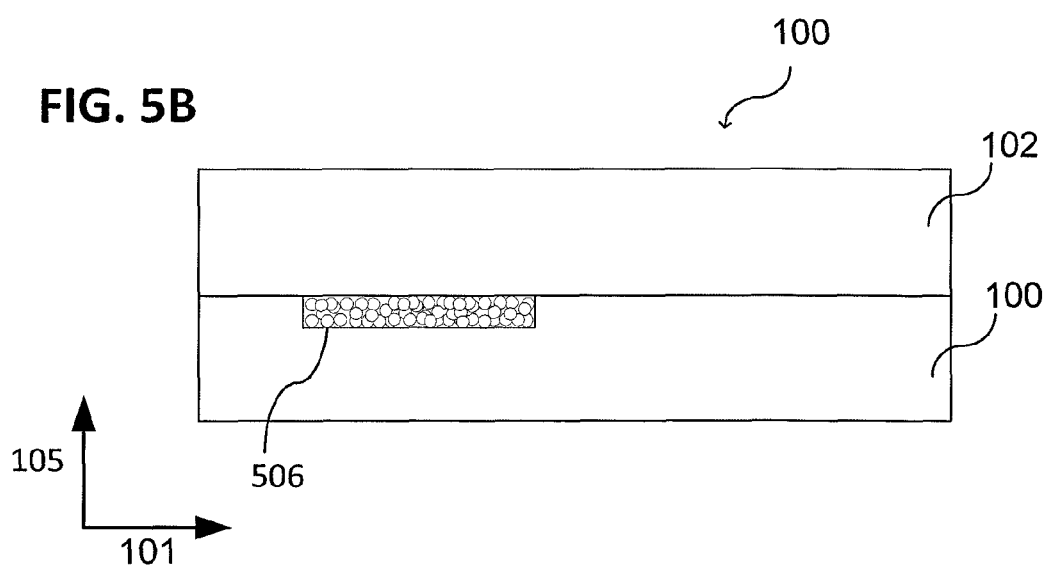
Figure 5C:
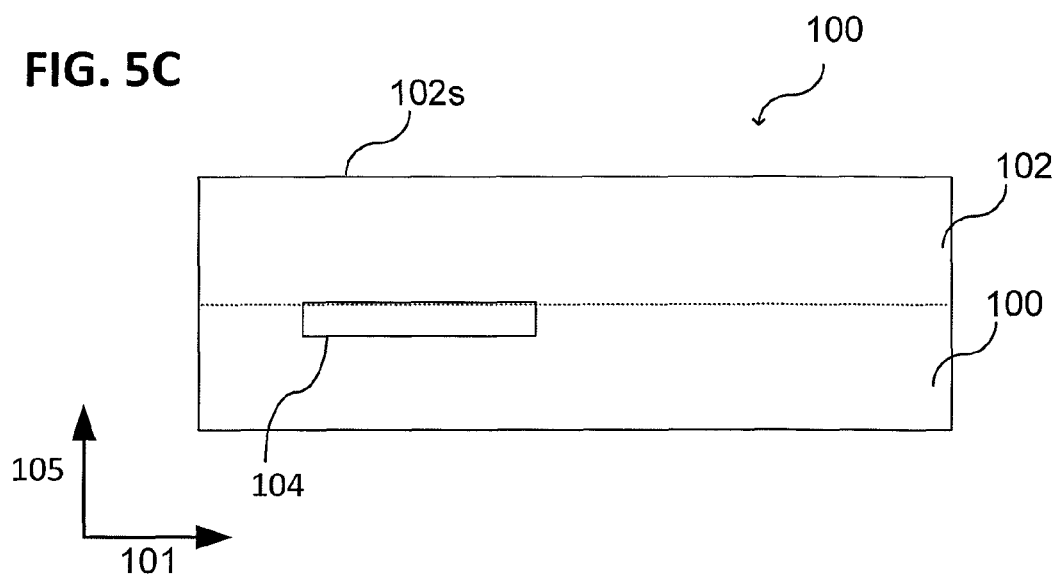
Figure 6A:
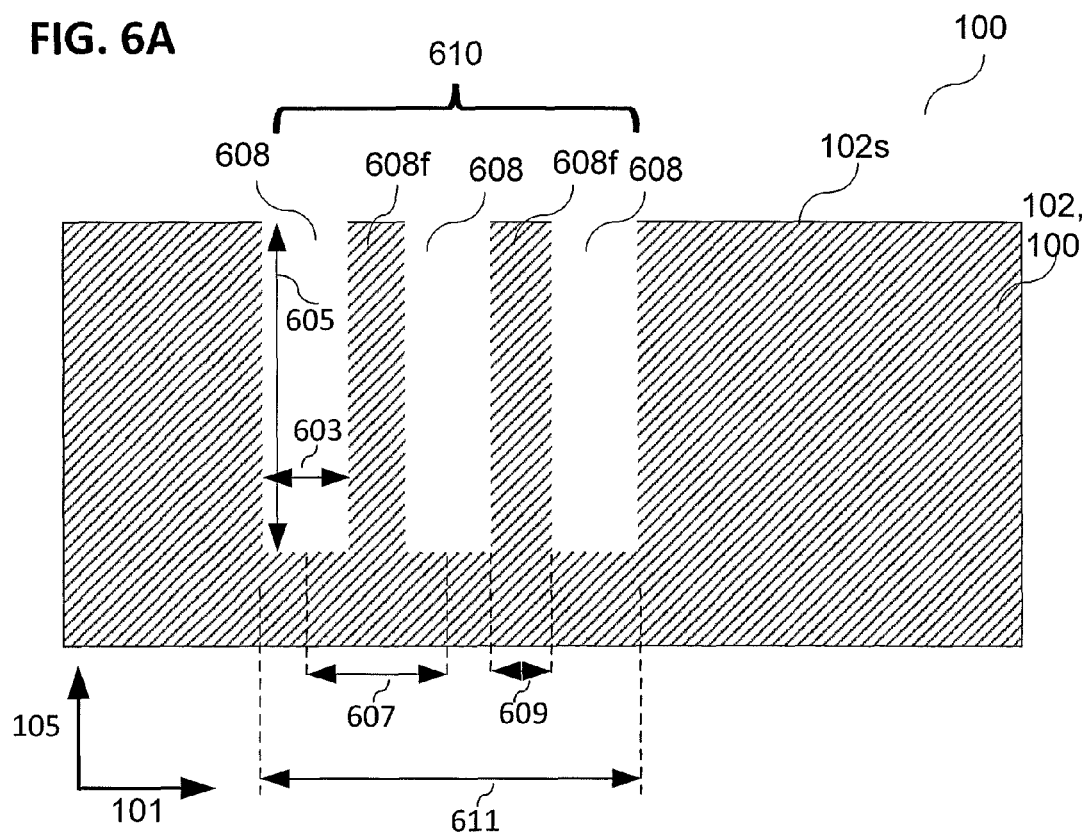
FIGS. 6A and 6B show respectively a cross sectional view or side view of a carrier during processing, according to various embodiments.
Figure 6B:
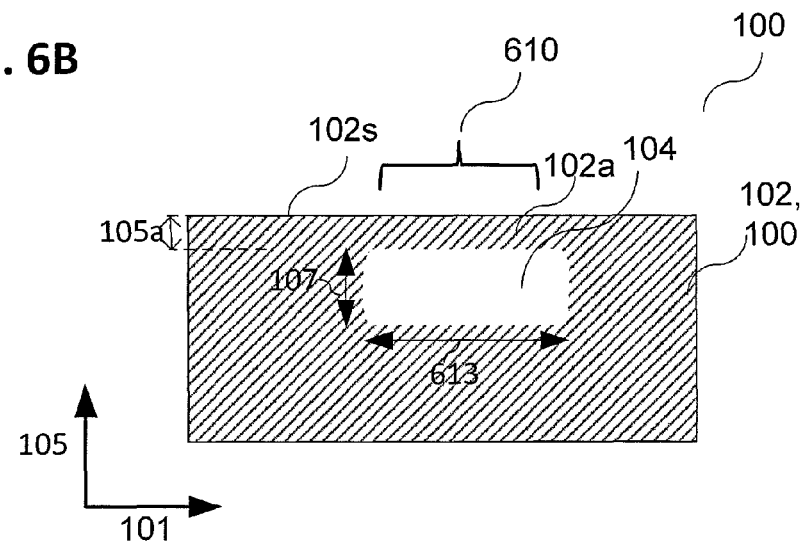

FIG. 4A shows a carrier 100 during processing, e.g. after the hollow chamber 104 has been formed in the carrier, wherein the hollow chamber 104 is spaced apart from the surface 102s of the carrier 100. According to various embodiments, the hollow chamber 104 may vertically separate a first region 102a of the carrier 100 from a third region 102c of the carrier 100. The hollow chamber 104 may extend laterally in the carrier 100 forming a plate-like cavity or opening. As described in the following, the hollow chamber 104 may be formed via annealing a porous structure being formed in the carrier (c.f. FIGS. 5A to 5C) or by annealing an opening structure or a plurality of openings (c.f. FIGS. 6A and 6B).

Figure 4B:
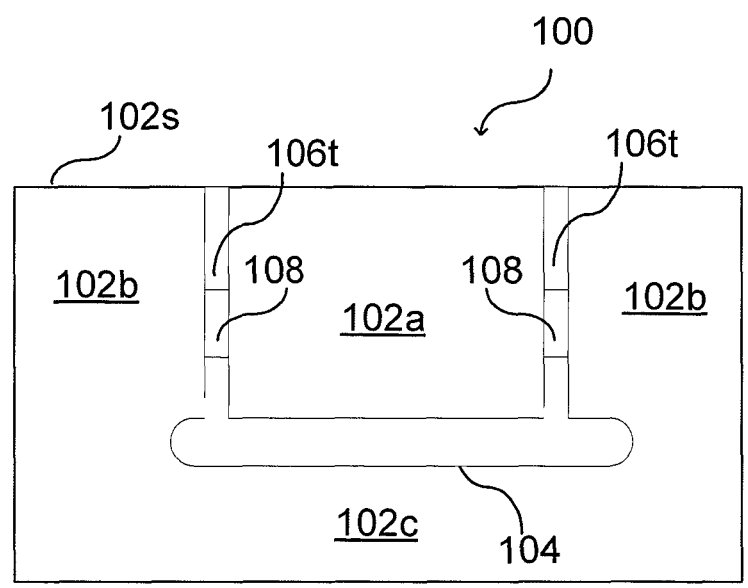

FIG. 4B shows a carrier 100 during processing, e.g. after the hollow chamber 104 has been formed in the carrier and after the trench structure 106 has been formed subsequently. As already described, the trench structure 106 may be formed by applying a patterning process or by patterning the carrier 100. According to various embodiments, firstly, a trench structure 106 may be formed including one or more trenches 106t and one or more support structures 108, wherein the support structures 108 may include the remaining silicon (from the silicon carrier 100) between the etched one or more trenches 106t.

Illustratively, the one or more trenches 106t and the one or more support structures 108 may be formed in the very same process step. This may be a cost efficient and a precisely controllable process since semiconductor patterning techniques may allow forming structures with a small feature size, e.g. smaller than about 100 nm. In case the one or more trenches were completely surrounding the first region 102a of the carrier 100 without forming the support structures 108 at the same time, the first region 102a of the carrier 100 might fall into the hollow chamber 104 or might fall off the carrier 100 or might be displaced from the desired position.

Alternatively, the first region 102a of the carrier 100 may be connected via an additional support structure (not shown in figures) to the third region 102c of the carrier 100 while the trench structure 106 is formed, and the additional support structure may be removed after the one or more trenches and the one or more support structures 108 are formed, such that the hollow chamber 104 is provided below the first region 102a of the carrier 100.

According to various embodiments, as illustrated in FIGS. 5A to 5C, forming a hollow chamber 104 in the carrier 100 (e.g. process 310 of method 300) may include: forming a porous structure 506 at least one of over and in a carrier 100', the porous structure 506 including a plurality of hollow chambers 506h (e.g. a plurality of pores 506h in the carrier material of the carrier 100'); and subsequently, forming a cover layer 102 over the carrier 100', the cover layer 102 covering the porous structure 506. According to various embodiments, the porous structure 506 may include one or more porous regions.

According to various embodiments, the hollow chamber 104 may be formed from the porous structure 506 covered with the cover layer 102 by performing an anneal process, such that the plurality of pores 506h may form a continuous hollow chamber 104, as described before. According to various embodiments, the cover layer 102 may include or may be a surface region of a carrier 100 including the hollow chamber 104 that may be obtained after forming the cover layer 102 and carrying out the anneal process. That is, the cover layer 102 may include or may be a part of the carrier 100. Subsequently, the trench structure 106 may be formed as described herein.

According to various embodiments, FIG. 5A shows a carrier 100' after a porous structure 506 has been formed in the carrier 100', the porous structure 506 may include a plurality of pores 506h (e.g. voids being surrounded by carrier material of the carrier 100'). The porous structure 506 may be formed by processing a selected region 102r of the carrier 100', wherein the carrier 100' may be for example a silicon substrate. The selected region 102r may be defined (or region 102r of the carrier 100' may be selected) by applying a mask material layer and patterning the mask material layer subsequently, such that a selected region 102r of the carrier 100' may be exposed. In other words, the selected region 102r may be defined by a patterned mask layer being arranged over the surface 102s of the carrier 100'.

The selected region 102r may be subsequently subjected to a physical and/or chemical treatment (e.g. a pore formation treatment) to provide a porous structure 506 in a selected region 102r of the carrier 100'. As described herein, the term "porosity" or related terms like "porous" structure, and the like, may be defined as the fraction of void within the material. For example, porous silicon may be divided into three categories based on the size of the pores included in the silicon: firstly, micro-porous silicon including pores having a diameter smaller than about 2 nm, secondly, meso-porous silicon including pores having a diameter in the range from about 2 nm to about 50 nm, and, thirdly, macro-porous silicon including pores having a diameter larger than about 50 nm.

Therefore, forming a porous structure 506 in a selected region 102r of the carrier 100' may include partially treating a silicon substrate 100' such that at least one porous region is formed in the silicon substrate 100' including at least one of macro-porous silicon, meso-porous silicon, and micro-porous silicon. According to various embodiments, forming a porous structure 506 in a selected region 102r of the carrier 100' may include introducing a plurality of pores 506h into the silicon substrate 100', the plurality of pores 506h forming the porous structure 506 in a selected region 102r of the carrier 100', e.g. by using an anodization process (e.g. performed in an anodization cell). An anodization cell may for example include a platinum cathode and a silicon carrier 100' being configured as anode in presence of an electrolyte, e.g. hydrogen fluoride ($HF_{aq}$) electrolyte. Thereby, the corrosion of the silicon substrate may be generated by applying a voltage between the platinum cathode and the silicon substrate and running electrical current through the anodization cell.

According to various embodiments, forming a porous silicon region in the carrier 100' by utilizing an anodization process may enable to generate a porosity of porous silicon in the range from about 5%© to about 90%. Further, the electrolyte being used in the anodization cell may include ethanol.

Further, according to various embodiments, forming a porous structure 506 in the selected region 102r of the carrier 100' may include introducing a plurality of pores 506h into the silicon substrate 100' by using stain etching or a so-called stain etch process.

A stain etch process may include performing a wet etch process using a stain-etchant, e.g. at least one of hydrofluoric acid, nitric acid and water, e.g. an etchant including hydrofluoric acid, nitric acid and water (e.g. a diluted solution of nitric acid in concentrated hydrofluoric acid). According to various embodiments, a porous silicon structure 506 may be formed by stain-etching, e.g. by subjecting an exposed region 102r of the silicon substrate 100' to a wet etchant including nitric acid ($HNO_3$) and hydrogen fluoride (HF).

After one or more porous structures 506 have been formed in the carrier 100', as shown in FIG. 5A, a cover layer 102 may be formed over the surface 102s of the carrier 100'; the cover layer 102 may cover the porous structure 506 completely. According to various embodiments, the cover layer 102 being formed over the surface of the carrier 100' may include silicon, wherein the carrier 100' may include silicon as well, therefore, a buried porous structure 506 may be formed within a carrier 100 including the carrier 100' and the cover layer 102, as illustrated in FIG. 5B. According to various embodiments, the cover layer 102 may be regarded as providing a part of a surface region 102 of the carrier 100.

According to various embodiments, a heat treatment may be carried out such that the hollow chamber 104 may be formed from the porous structure 506. Illustratively, the material (silicon) of the porous structure 506 may migrate and/or diffuse forming a hollow chamber 104 during a heat treatment performed in a hydrogen containing atmosphere. According to various embodiments, the heat treatment (anneal) may include annealing the porous structure 506 at a temperature in the range from about 900° C. to about 1100° C. (c.f. the venetia process). According to various embodiments, the pores 506h of the porous structure 506 may grow together during the thermal treatment, such that a single hollow chamber 104 may be formed, as shown in FIG. 5C. The carrier 100 illustrated in FIG. 5C may be further processed as already described, e.g. a trench structure 106 may be formed in the cover layer 102 of the carrier 100.

According to various embodiments, the region 102r in the carrier 100 defining the size of the porous structure 506 may be selected by providing different types of doping in the region 102r and in the part of the carrier 100 surrounding the region, respectively, since the formation of the porous structure 506 may be influenced by doping the carrier.

FIGS. 6A and 6B illustrate a method for forming a hollow chamber 104 in the carrier 100 according to various embodiments.

According to various embodiments, forming the hollow chamber 104 within the carrier 100 may include: forming an opening structure 610 in the carrier 100, the opening structure 610 including one or more openings 608, each of the one or more openings 608 extending from the surface 102s of the carrier 100; and performing an anneal process such that the hollow chamber 104 is formed in the carrier 100 from the opening structure 610.

In one or more embodiments, a method for processing a carrier may include: Minting at least one opening structure 610 at least one of over and in a surface region 102 of the carrier 100; and subsequently annealing the at least one opening structure 610 such that one or more hollow chambers 104 may be formed by material of the at least one opening structure 610. According to various embodiments, a plurality of hollow chambers 104 may be formed in the carrier 100 providing a plurality of first regions 102a that may be isolated from the rest of the carrier 100.

As schematically illustrated in FIG. 6A, according to various embodiments, the opening structure 610 may include one or more openings 608 (e.g. recesses or holes) formed in the carrier 100. According to various embodiments, the same opening structure 610 may be formed by patterning a previously deposited surface layer 102, e.g. by forming one or more structure elements 608f at least one of over and in the carrier 100.

The carrier 100 may be a semiconductor carrier, e.g. a semiconductor wafer, e.g. a silicon wafer 100 or a silicon substrate 100, as already described. The carrier 100 may be an arbitrary type of carrier, as already described, including a carrier surface layer 102, wherein the carrier surface layer 102 may be a silicon layer 102. The process of forming the opening structure 610 in a carrier 100, as described herein, may be applied in analogy to a carrier 100 having a silicon surface 102 layer, which may be not described in more detail for sake of brevity.

A process for forming at least one opening structure 610 at least one of over and in the carrier 100 may include patterning the carrier 100. Therefore, a patterned mask layer may be disposed over the carrier 100, wherein the patterned mask layer may at least partially cover the carrier 100 and may expose at least one region of the carrier 100 to be etched, and subsequently carrier material may be partially removed from the at least one exposed region of the carrier 100 to form at least one opening structure 610 in the carrier 100.

According to various embodiments, the shape, the size, the positions, and the number of openings 608 included in the opening structure 610 may be selected in accordance with the desired shape of the hollow chamber 104 to be formed in the carrier 100. The shape, the size, the positions, and the number of opening structures 610 may be selected in accordance with the desired shape, size, positions, and number of hollow chambers 104 to be formed in the carrier 100.

According to various embodiments, at least one etch process may be applied to partially remove the respective carrier material to provide the at least one opening structure 610, wherein the least one etch process may include a dry etch process, e.g. reactive ion etching, e.g. deep reactive ion etching. A reactive etch process, as described herein, may include at least one of the following etch chemistries: $SF_6$, $O_2$, HBr, $NF_3$, $C_4F_8$, and $C_4F_6$. The etch process may be selective to the carrier material, e.g. selective to silicon, such that a patterned mask layer may be utilized to remove the carrier material partially at the desired positions, and therefore, forming at least one opening structure 610 at the desired position. The openings 608 of the opening structure 610 may be surrounded by carrier material (silicon). The openings 608 included in the at least one opening structure 610 may have an aspect ratio (the ratio of the depth 605 of the opening 608 to the width 603 of the opening 608), in the range from about 2 to about 30, e.g. in the range from about 2 to about 20, e.g. in the range from about 2 to about 10.

As shown in FIG. 6A, a plurality of openings 608 (e.g. recesses, trenches, holes) may be formed in carrier 100. The plurality of openings 608 may represent the opening structure 610. Each opening 608 of the plurality of openings may have a rectangular shape or a quadratic shape in the cross sectional view as illustrated in FIG. 6A. The base area of an opening 608 included in the at least one opening structure 610, e.g. seen from the top, may have the shape as defined by the patterned mask layer, e.g. a rectangular shape, a quadratic shape, a polygonal shape, a circular shape or an elliptic shape. An opening 608 may have the form (or shape) of a right prism, e.g. a cube, a cuboid, a cylinder and the like.

As shown in the cross sectional view in FIG. 6A, at least one opening 608 of the plurality of openings 608, e.g. all openings of the plurality of openings 608, may have a depth 605 in the range from about 1 μm to about 100 μm, e.g. in the range from about 1 μm to about 50 μm. According to various embodiments, at least one opening 608 of the plurality of openings 608, e.g. all openings of the plurality of openings 608, may have a width 603 (or in the case of cylindrical shapes a diameter 603) in the range from about 0.1 μm to about 50 μm, e.g. in the range from about 0.2 μm to about 20 μm, e.g. in the range from about 0.5 μm to about 5 μm. According to various embodiments, the distance 607 between two adjacent openings 608 of the opening structure 610, measured from the center of a first opening to the center of an adjacent second opening, may be in the range from about 0.2 μm to about 100 μm. Therefore, according to various embodiments, the width 609 of the remaining carrier material 608f between respectively two adjacent openings 608 of the opening structure 608 may be, as a result of the width 603 and the distance 607, in the range from about 0.1 μm to about 100 μm.

According to various embodiments, the depth 605 of an opening 608 of the opening structure 610 may define or may influence the depth position (e.g. the depth 105a) of the respective hollow chamber 104 formed from the opening structure 610, e.g. in a subsequently performed annealing process or heat treatment (c.f. FIG. 6B). The aspect ratio of an opening 608 of the opening structure 610 may define or may influence the size of the respective hollow chamber 104 formed from the openings 608, e.g. in a subsequently performed annealing process. In summary, the arrangement of the one or more openings 608 in the opening structure 610 (or the arrangement of more than one opening structure 610 in the carrier 100) may determine and/or influence the arrangement of the one or more hollow chambers 104 generated in the carrier 100, e.g. the one or more hollow chambers 104 may be formed from the opening structure 610 during a subsequently performed annealing process. According to various embodiments, the width 613 of the hollow chamber 104 may be defined by the width 611 of the opening structure 610.

According to various embodiments, the at least one opening structure 610 may include one opening or more than one opening, e.g. any other number of openings, e.g. two, three, four, five, six, seven, eight, nine, ten, or even more than ten, or more than 20 over even hundreds of openings 608, depending on the desired number, shape and/or size of hollow chambers 104 to be formed.

An annealing process may be carried out after the opening structure 610 has been formed. As illustrated in FIG. 6B, at least one (one or more) hollow chamber 104 may be formed during the annealing of the opening structure 610 is carried out, e.g. due to the migration of material of the at least one opening structure 610, e.g. due to the migration of silicon 608f surrounding the openings 608. The migration of material of the opening structure 610 may form one or more hollow chambers 104 in the carrier 100 separating a first region 102a of the carrier 100. According to various embodiments, the lateral extension 613 of the one or more hollow chambers 104 may be in a range from about several hundreds of nanometers up to several micrometers or even up to several hundreds of micrometers.

According to various embodiments, the thickness 105a of the material layer covering the at least one hollow chamber 104 or thickness 105a of the material region 102a (the isolated region 102a) above the at least one hollow chamber 104 may be in the range from about 0.2 μm to about 100 μm. The material layer or the material region 102a covering the at least one hollow chamber 104 may include silicon (e.g. doped silicon). Further, the carrier 100 may form a new surface 102s during the annealing of the opening structure 610.

According to various embodiments, the annealing process being utilized for forming the one or more hollow chambers 104 from the opening structure 610 may cause at least one of migration, diffusion, material transport, and material rearrangement of the material surrounding the one or more openings 608 included in the opening structure 610 while forming the one or more hollow chambers 104.

According to various embodiments, the annealing process being utilized to form the one or more hollow chambers 104 from the opening structure 610 may be performed using temperatures in the range from about 800° C. to about 1400° C., e.g. in the range from about 900° C. to about 1300° C., e.g. in the range from about 1100° C. to about 1200° C. According to various embodiments, the duration of the annealing process may be at least in the range from about several minutes, e.g. larger than 5 min, e.g. larger than 10 min, e.g. larger than 20 min. According to various embodiments, the annealing process may be carried out under vacuum conditions. According to various embodiments, the annealing process may be carried out in the absence of a significant oxygen amount (or oxygen partial pressure), e.g. in nitrogen atmosphere, e.g. in an argon atmosphere, e.g. in a chemically reducing atmosphere including nitrogen and hydrogen (e.g. a mixture of nitrogen with 2% to 20% hydrogen (substance amount fraction)), e.g. in a chemically reducing atmosphere including argon and hydrogen (e.g. a mixture of argon with 2% to 20% hydrogen (substance amount fraction)).

According to various embodiments, one or more hollow chambers 104 may also be referred to as empty space in silicon and the first region 102a over a hollow chamber 104 may be referred to as silicon on nothing (SON) structure or migrated silicon region. Illustratively, since the empty space may be electrically isolating, the first region 102a over a hollow chamber 104 may be referred to as silicon on insulator SOI-structure. The migrated silicon region may have a first thickness after the annealing process, wherein additional material may be deposited over the annealed carrier increasing the thickness of the isolated region 102a over the one or more hollow chambers 104.

According to various embodiments, the size and/or the shape of the one or more hollow chambers 104, the thickness of the migrated silicon region 102a, and the position of the one or more hollow chambers 104 may be controlled and/or influenced by the design of the opening structure 610, and therefore, by patterning the carrier 100, which may be performed using processes of semiconductor industry, as described herein. The one or more hollow chambers 104 may be surrounded by silicon, e.g. completely surrounded by silicon. In other words, the one or more hollow chambers 104 may not have an opening to a surface of the carrier 100 after being formed via the annealing process.

According to various embodiments, the size, the shape, and the position of the one or more hollow chambers 104 may not significantly change or vary in a further heat treatment. According to various embodiments, the one or more hollow chambers 104 may be stable in size, shape, and/or position up to temperatures of about 1300° C. According to various embodiments, the one or more hollow chambers 104 may provide a stable electrically insulating structure 104 in a carrier, wherein the carrier may be processed at high temperatures, as for example typical high temperature processes included in manufacturing an integrated circuit, e.g. in manufacturing a CMOS-structure, e.g. in manufacturing a power semiconductor device, e.g. in manufacturing a transistor, e.g. in manufacturing a photo sensor, and for example in manufacturing a micro electromechanical system.

Figure 7:
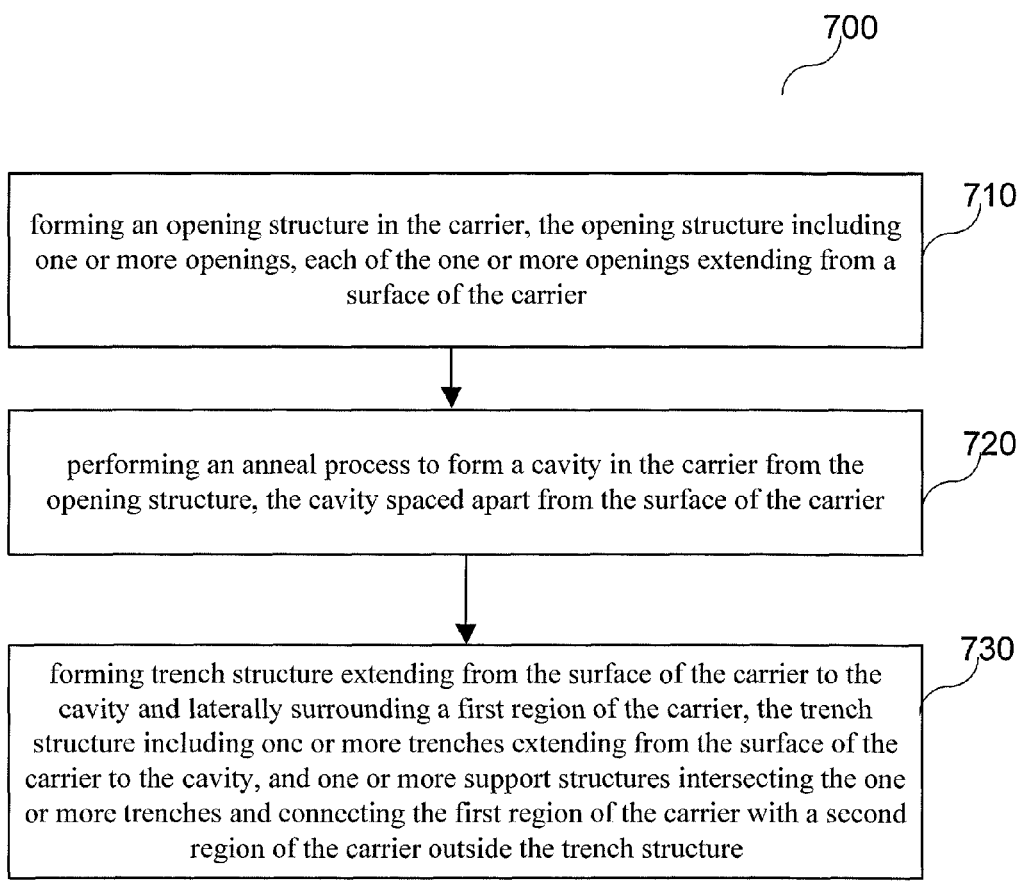
FIG. 7 shows a schematic flow diagram of a method for processing a carrier, according to various embodiments.

FIG. 7 shows a schematic flow diagram of a method 700 for processing a carrier 100, the method including: in 710, forming an opening structure 610 in the carrier 100, the opening structure 610 including one or more openings 608, each of the one or more openings 608 extending from a surface 102s of the carrier 100; in 720, performing an anneal process to form a hollow chamber 104 in the carrier 100 from the opening structure 610, the hollow chamber 104 spaced apart from the surface 102s of the carrier 100; and, in 730, forming trench structure 106 extending from the surface 102s of the carrier 100 (e.g. the surface 102s formed during the annealing) to the hollow chamber 104 and laterally surrounding a first region 102a of the carrier 100, the trench structure 106 may include one or more trenches 106t extending from the surface 102s of the carrier 100 to the hollow chamber 104, and one or more support structures 108 intersecting the one or more trenches 106t and connecting the first region 102a of the carrier 100 with a second region 102b of the carrier 100 outside the trench structure 106.

According to various embodiments, the support structure 108 may be formed during forming the trench structure 106, e.g. at the same time as the one or more trenches 106t may be formed. After the support structure 108 has been formed, the support structure 108 may include silicon, wherein the support structure 108 may be oxidized (partially or completely) during a subsequently performed thermal oxidation process, e.g. in oxygen containing atmosphere at temperatures in the range from about 800° C. to about 1000° C. (e.g. using a laser heater or a light heater) for about several minutes.

According to various embodiments, the support structure 108 may be designed to be easily destroyed by applying a mechanical force on the first region 102a of the carrier 100, e.g. for performing a so-called Pick, Crack & Place™ process to spatially remove the first region 102a of the carrier 100 (the SON-structure or the SOI-structure) from the carrier 100.

According to various embodiments, the first region 102a of the carrier 100 may be removed from the carrier 100 after an electronic component 122 has been formed in the first region 102a of the carrier 100, as already described.

Alternatively, the first region 102a of the carrier 100 may be utilized to manufacture an electronic device including an SON-structure or SOI-structure, e.g. to electrically separated a first electronic component from a second electronic component.

According to various embodiments, a carrier may include: a hollow chamber 104 laterally extending within the carrier 104 providing a vertically separated first region 102a over the hollow chamber 104; a trench structure 106 including a trench 106t and a support structure 108, the trench 106t extending vertically from an upper surface 102s of the carrier 100 to the hollow chamber 104 and laterally surrounding the first region 102a, wherein the support structure 108 connects or attaches the first region 102a to the rest of the carrier 100, and wherein the support structure 108 may include an electrically insulating oxide.

According to various embodiments, a method for processing a carrier may include: forming a hollow chamber 104 laterally extending within the carrier 100 and thereby providing a first region 102a over the hollow chamber 104 being vertically separated from the carrier 100; forming a trench structure 106 laterally surrounding the first region 102a, wherein the trench structure 106 may include at least one trench 106t extending vertically from the upper surface 102s of the carrier 100 to the hollow chamber 104; wherein the trench structure 106 may include a support structure 108 laterally connecting the first region 102a to the rest of the carrier 100, and oxidizing the support structure 108 to electrically isolate the first region 102a from the carrier 100.

According to various embodiments, a method for processing a carrier may include: forming an opening structure 610 at an upper surface 102s of a carrier 100, performing an anneal process such that a hollow chamber 104 is formed from the opening structure 610 extending laterally within the carrier 100, wherein a first region 102a is provided over the hollow chamber 104 being vertically separated from the carrier 100 via the hollow chamber 104; forming a trench structure 106 including at least one trench 106t surrounding the first region 102a, wherein the at least one trench 106t may extend vertically from the upper surface 102s of the carrier 100 to the hollow chamber 104, thereby laterally separating the first region 102a from the carrier 100, wherein the trench structure 106 may further include a support structure 108 laterally connecting the first region 102a to the carrier 100 such that the first region 102a is carried by the support structure 108. Further, the support structure may include an electrically insulating oxide electrically isolating the first region 102a from the carrier 100.

According to various embodiments, a carrier 100 may include a hollow chamber 104 spaced apart from a surface 102s of the carrier; a trench structure 106 extending from the surface of the carrier to the hollow chamber and laterally surrounding a first region 102a of the carrier, the trench structure including one or more trenches 106t extending from the surface of the carrier to the hollow chamber, and one or more support structures 108 intersecting the one or more trenches and connecting the first region of the carrier with a second region 102b of the carrier outside the trench structure, wherein the one or more support structures includes an electrically insulating material.

According to various embodiments, the electrically insulating material may include an oxide. In other words, the support structure 108 may consist of or may include an electrically insulating oxide, e.g. silicon oxide.

According to various embodiments, the one or more support structures may extend laterally between the first region of the carrier and the second region of the carrier.

According to various embodiments, the carrier may be a semiconductor carrier. According to various embodiments, the carrier may be a silicon wafer.

According to various embodiments, the carrier may include silicon and the one or more support structures may include silicon oxide. According to various embodiments, the one or more support structures may include an oxide of the carrier material.

According to various embodiments, the first region of the carrier may be electrically isolated from the rest of the carrier via the one or more trenches, the one or more support structures, and the hollow chamber. According to various embodiments, the first region of the carrier may be spatially separated from the rest of the carrier via the one or more trenches and the hollow chamber, and the first region of the carrier may be connected to the carrier via the one or more support structures.

According to various embodiments, the hollow chamber may be free of solid material. According to various embodiments, the hollow chamber may be partially free of a solid material, e.g. partially filled with a filling material.

According to various embodiments, the one or more trenches may be free of a solid material. According to various embodiments, the one or more trenches may be partially free of a solid material, e.g. partially filled with a filling material.

According to various embodiments, the one or more trenches and the hollow chamber may provide a gap structure between the first region 102a of the carrier 100 and the rest of the carrier 100 (e.g. the second region 102b and the third region 102c).

According to various embodiments, the carrier may further include a first electronic circuit at least one of over and in the first region of the carrier. According to various embodiments, the carrier may further include a first electronic component being arranged at least one of over and in the first region of the carrier.

According to various embodiments, the carrier may further include a second electronic circuit at least one of over and in the second region of the carrier outside the trench structure. According to various embodiments, the carrier may further include a second electronic component being arranged at least one of over and in the second region of the carrier outside the trench structure, e.g. laterally outside the trench structure.

According to various embodiments, the surface of the carrier may define a lateral direction (parallel to the surface (main processing surface) of the carrier).

According to various embodiments, a method for processing a carrier may include: forming a hollow chamber within the carrier and spaced apart from a surface of the carrier; forming a trench structure extending from the surface of the carrier to the hollow chamber and laterally surrounding a first region of the carrier, the trench structure including one or more trenches extending from the surface of the carrier to the hollow chamber, and one or more support structures intersecting the one or more trenches and connecting the first region of the carrier with a second region of the carrier outside the trench structure, wherein the one or more support structures include or consist of an electrically insulating material.

According to various embodiments, forming the hollow chamber within the carrier may include: forming an opening structure in the carrier, the opening structure including one or more openings, each of the one or more openings extending from the surface of the carrier; and performing an anneal process such that the hollow chamber is formed in the carrier from the opening structure.

According to various embodiments, forming the hollow chamber within the carrier may include: forming at least one porous region in the carrier, and performing an anneal process such that the hollow chamber is formed in the carrier from the porous region.

According to various embodiments, forming the trench structure may include: forming one or more trenches extending from the surface of the carrier to the hollow chamber, wherein carrier material remains between the one or more trenches, and at least partially oxidizing the remaining carrier material within the trench structure to form the one or more support structures.

According to various embodiments, a method for processing a carrier may include: forming an opening structure in the carrier, the opening structure including one or more openings, each of the one or more openings extending from a surface of the carrier; performing an anneal process to form a hollow chamber in the carrier from the opening structure, the hollow chamber may be spaced apart from the surface of the carrier; forming trench structure extending from the surface of the carrier to the hollow chamber and laterally surrounding a first region of the carrier, the trench structure including one or more trenches extending from the surface of the carrier to the hollow chamber, and one or more support structures intersecting the one or more trenches and connecting the first region of the carrier with a second region of the carrier outside the trench structure.

According to various embodiments, forming the trench structure may include: forming one or more trenches extending from the surface of the carrier to the hollow chamber, wherein carrier material remains between the one or more trenches providing the one or more support structures intersecting the one or more trenches.

According to various embodiments, the method of processing a carrier may further include: partially oxidizing the one or more support structures.

According to various embodiments, the method of processing a carrier may further include: completely oxidizing the one or more support structures.

According to various embodiments, the method of processing a carrier may further include: forming a first electronic circuit at least one of over and in the first region of the carrier. According to various embodiments, the method of processing a carrier may further include: forming a first electronic component at least one of over and in the first region of the carrier.

According to various embodiments, the method of processing a carrier may further include: separating or removing the first region from the carrier. According to various embodiments, the separating may include picking the first region, cracking the support structure and spatially removing the first region from the carrier.

According to various embodiments, the method for processing a carrier may further include spatially separating and/or removing the cap region from the carrier, e.g. performing a so-called Pick, Crack & Place™ process.

According to various embodiments, the method for processing a carrier may further include spatially removing the cap region from the carrier; e.g. performing a so-called Pick, Crack & Place™ process.

According to various embodiments, the method for processing a carrier may further include detaching the cap region from the carrier.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A carrier comprising:
    a hollow chamber spaced apart from a surface of the carrier; a trench structure extending from the surface of the carrier to the hollow chamber and laterally surrounding a first region of the carrier, the trench structure comprising one or more trenches extending from the surface of the carrier to the hollow chamber, and one or more support structures intersecting the one or more trenches and connecting the first region of the carrier with a second region of the carrier outside the trench structure, wherein the one or more support structures comprise an electrically insulating material; and
    a second electronic circuit at least one of over and in the second region of the carrier outside the trench structure,
    further comprising a first electronic circuit at least one of over and in the first region of the carrier, wherein the first electronic circuit is separate from the second electronic circuit.

2. The carrier according to claim 1,
wherein the electrically insulating material comprises an oxide.

3. The carrier according to claim 1,
wherein the one or more support structures extend laterally between the first region of the carrier and the second region of the carrier.

4. The carrier according to claim 1,
wherein the carrier is a semiconductor carrier.

5. The carrier according to claim 1,
wherein the carrier comprises silicon, and wherein the one or more support structures comprising silicon oxide.

6. The carrier according to claim 1,
wherein the first region of the carrier is electrically isolated from the rest of the carrier via the one or more trenches, the one or more support structures, and the hollow chamber.

7. The carrier according to claim 1,
wherein the hollow chamber is free of solid material.

8. The carrier according to claim 1,
wherein the one or more trenches are free of solid material.

* * * * *